United States Patent [19]

Kato et al.

[11] Patent Number: 5,214,609
[45] Date of Patent: May 25, 1993

[54] SEMICONDUCTOR INTEGRATED CIRCUIT

[75] Inventors: Hideo Kato; Hiroto Nakai, both of Kawasaki; Hiroshi Iwahashi; Nobuaki Hiraga, both of Yokohama, Yokohama, all of Japan

[73] Assignee: Kabushiki Kaisha Toshiba, Kawasaki, Japan

[21] Appl. No.: 751,768

[22] Filed: Aug. 29, 1991

[30] Foreign Application Priority Data

Aug. 30, 1990 [JP] Japan .................................. 2-228664

[51] Int. Cl.$^5$ ............................................. G11C 13/00
[52] U.S. Cl. .......................... 365/230.01; 365/189.05; 365/210; 365/230.08
[58] Field of Search ...................... 365/189.01, 230.01, 365/230.08, 189.05, 189.04, 230.03, 210

[56] References Cited

U.S. PATENT DOCUMENTS 5,086,414 2/1992 Nambu et al. ................... 365/230.08

Primary Examiner—Terrell W. Fears
Attorney, Agent, or Firm—Finnegan, Henderson, Farabow, Garrett & Dunner

[57] ABSTRACT

In the semiconductor integrated circuit, the data delay circuit and data latch circuit are connected between the sense amplifier circuit and the output buffer circuit. A pulse signal for controlling the output buffer is first generated according to a pulse output signal of the address change detection circuit, and then a latch signal which permits output data of the data detection circuit obtained before the change of the address input signal to be latched by the data latch circuit for a preset period of time is generated. Next, a delay signal is generated which sets the delay time of the data delay circuit to be short in a case where data detected by the data detection circuit is not output from the output buffer circuit, and sets the delay time of the data delay circuit to be long in a case where data is output from the output buffer circuit. Generation of the delay signal is interrupted after the pulse signal of the address change detection circuit is interrupted. As a result, the power source variation at the time of output data change or erroneous operation due to noise input from the exterior can be prevented. Further, the driving ability of the output buffer transistor can be set to a large value so that a highly reliable semiconductor integrated circuit in which the operation margin of the integrated circuit with respect to the power source variation and noise can be made large while keeping the data readout speed high can be obtained.

3 Claims, 17 Drawing Sheets

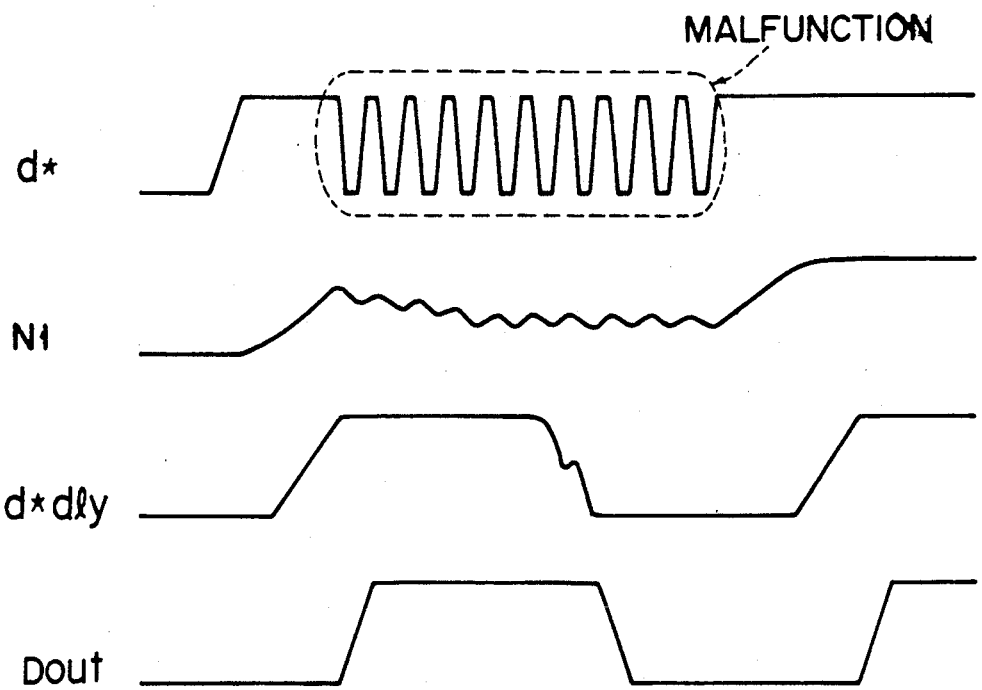
F I G. 6A
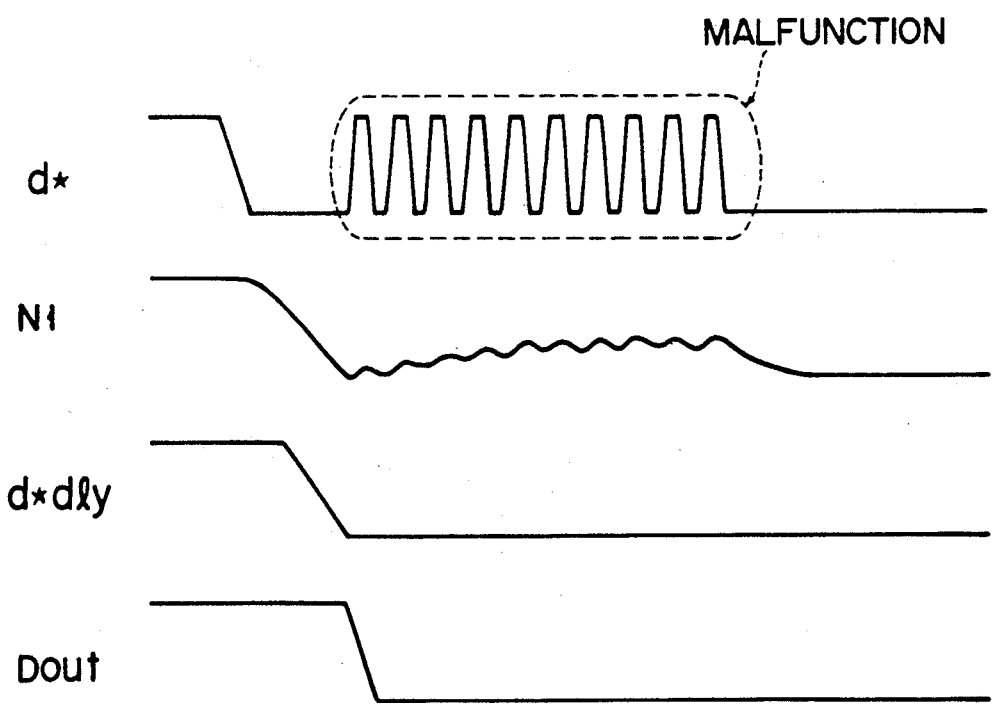
F I G. 6B

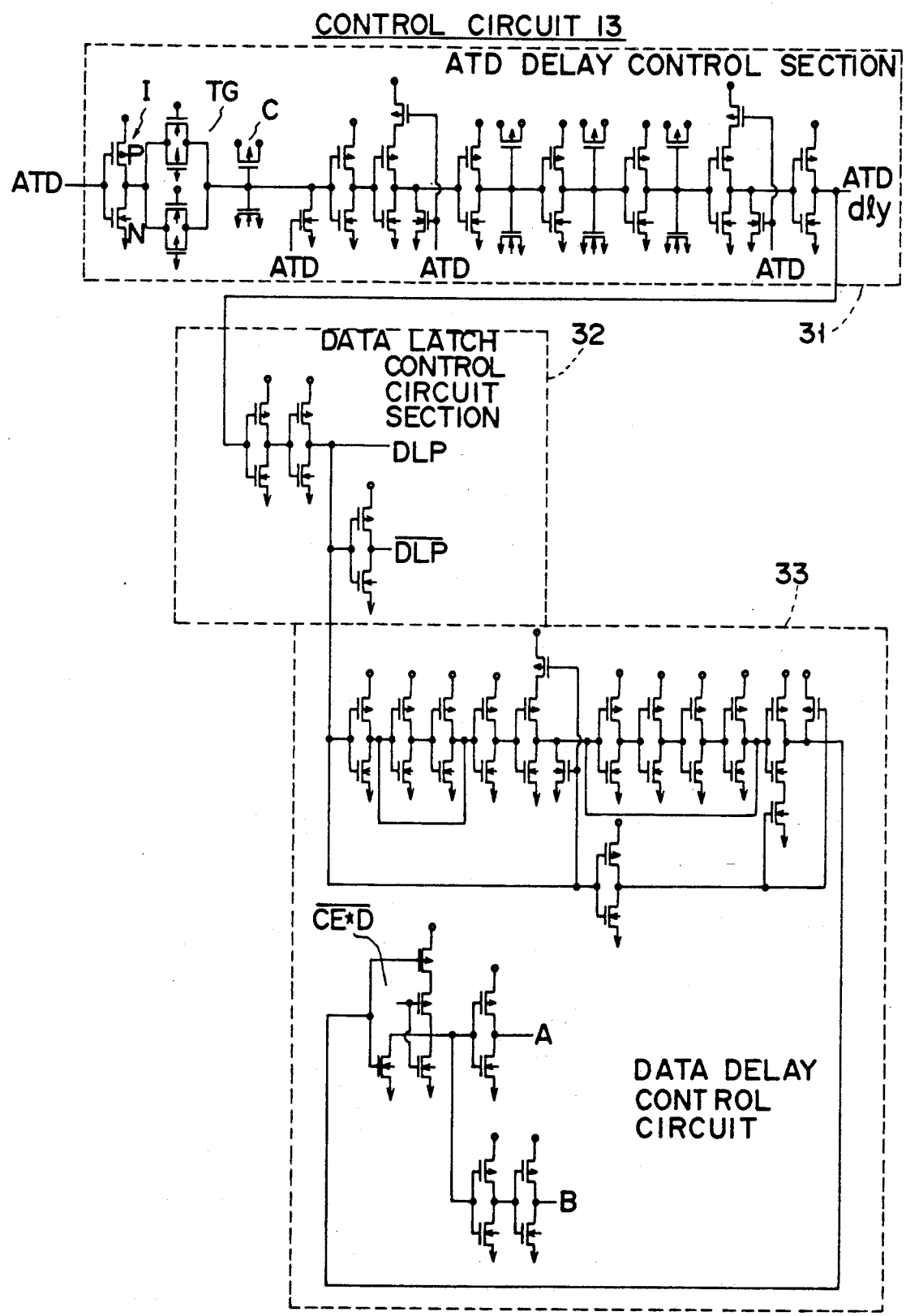
F I G. 13

MEMORY CELL ARRAY 5, COLUMN SELECTION GATE 6 & SENSE AMPLIFIER CIRCUIT 7.

SEMICONDUCTOR INTEGRATED CIRCUIT

BACKGROUND OF THE INVENTION

1. Field of the Invention

This invention relates to a semiconductor integrated circuit, and more particularly to a logic circuit for logically processing a delay signal and a data delay circuit used in a data readout circuit of a semiconductor memory.

2. Description of the Related Art

A conventional semiconductor memory, for example, an EPROM (electrically programmable nonvolatile semiconductor memory) is generally constructed as shown in FIG. 1. In FIG. 1, Ai (i=0 to k) is a row address input signal and is input to a row decoder circuit 2 after being amplified and shaped by a row address buffer circuit 1. Bj (j=k+1 to n) is a column address input signal and is input to a column decoder circuit 4 after being amplified and shaped by a column address buffer circuit 3. The row decoder circuit 2 selects one of the word lines of a memory cell array 5 in which memory cells for storing data are arranged and the column decoder circuit 4 controls a column selection gate 6 to select one of the bit lines of the memory cell array 5. Thus, one of the memory cell transistors is selected from the memory cell array 5 and data of the selected memory cell is amplified and sensed by a sense amplifier circuit 7. Data sensed by the sense amplifier circuit 7 is read out to the exterior of the chip via a output buffer 8.

The inventors of this invention proposed a highly reliable semiconductor integrated circuit in Japanese Patent Application No. 63-291969 in which a data delay circuit 9 and a data latch circuit 10 are connected between the sense amplifier circuit 7 and the output buffer circuit 8 as shown in FIG. 1, and fluctuation in the power source voltage at the time of change of output data or an erroneous operation of the internal circuit of the integrated circuit due to noise input from the exterior can be prevented by controlling the data delay circuit 9, data latch circuit 10 and output buffer control circuit 11 according to an address change detecting signal ATD and the driving ability of an output stage transistor can be enhanced, thereby making it possible to increase the operation margin of the integrated circuit chip with respect to the power source voltage fluctuation and noise without lowering the data readout speed.

In the above semiconductor integrated circuit, outputs of the row address buffer circuit 1 and the column address buffer circuit 3 are input to corresponding address change detection circuits 12 and pulse outputs of the address change detection circuits 12 are supplied to a OR circuit 16 so that a pulse signal (address change detection signal) ATD having a preset pulse width may be generated when at least one of the address input signals Ai and Bj is changed and the signal ATD is input to a control circuit 13.

The control circuit 13 generates a signal ATDdly for controlling the output buffer control circuit 11, signals DLP and $\overline{DLP}$ for controlling the data latch circuit 10 and signals A and B for controlling the data delay circuit 9.

The data delay circuit 9 includes a delay circuit 91 supplied with an output signal d* of the sense amplifier circuit 7 and a bypass circuit 92 for bypassing the signal d*. In the delay circuit 9, since the input signal d* is output with preset delay time (for example, several tens of nanoseconds) when the delay circuit 91 is operated, noise can be absorbed by the data delay circuit 9 even when the noise superposed on the output signal d* by the erroneous operation of the sense amplifier circuit 7 caused by noise input from the exterior or fluctuation in the power source voltage at the time of output data change and if the duration of the noise is less than the preset delay time. That is, the data delay circuit 9 functions as a noise canceller (this state is hereinafter referred to as an operative state of the data delay circuit 9). Further, when the address change detection signal ATD is changed and the data delay circuit controlling signals A and B are changed, the output signal d* of the sense amplifier circuit 7 is instantaneously output via the bypass circuit 92 without any delay (this state is hereinafter referred to as a non-operative state of the data delay circuit 9).

Output data d*dly of the data delay circuit 9 is input to the data latch circuit 10. When the address change detection signal ATD is changed in response to the address change and data latch controlling signals DLP and $\overline{DLP}$ are changed, the data latch circuit 10 latches data corresponding to the address before the address change has occurred for a preset period of time and outputs the latched data d*lat via the output buffer circuit 8. The state in which data is latched by the data latch circuit 10 is hereinafter referred to as an operative state of the data latch circuit 10 and the state in which no data is latched in the data latch circuit 10 is hereinafter referred to as a non-operative state of the data latch circuit 10.

A $\overline{CE}$ buffer circuit 14 shapes and amplifies a chip enable input signal (or chip selection signal) $\overline{CE}$ from the exterior of the integrated circuit and creates an internal chip enable signal CE* for setting the integrated circuit chip into an operative state or stand-by state.

A $\overline{CE}$ equalization controlling circuit 15 generates a control signal (complementary signals ST and $\overline{ST}$) for controlling the sense amplifier circuit 7 in order to enhance the data readout speed when the chip enable input signal $\overline{CE}$ is changed and data is read out. That is, in a case where the chip enable input signal $\overline{CE}$ is changed and data is read out, the readout operation is delayed by a period of time required for the integrated circuit chip to be set into the operative state by the internal chip enable signal $\overline{CE^*}$ in comparison with a case wherein the address input signal is changed and then data is read out. In order to solve the above problem, the potential of a column line to which data read out from the memory cell is supplied is set to an intermediate potential between the potentials corresponding to "1" and "0" of the data of the memory cell by use of the signals ST and $\overline{ST}$ in a period of time after the signal $\overline{CE}$ is changed and the signal CE* is set to the active state until a memory cell corresponding to the input address is selected. In this case, since the potential of the column line is changed from the intermediate potential level to the "1" potential level or "0" potential level, data can be more rapidly read out.

Further, the output buffer control circuit 11 shapes and amplifies an output enable input signal $\overline{OE}$ from the exterior of the integrated circuit and generates an internal output buffer control signal (complementary signals OE* and $\overline{OE^*}$) for setting the output buffer circuit 8 into the data readout permissible state (operative state) or the non-operative state.

Next, the operation of the memory shown in FIG. 1 is explained with reference to the timing signal waveforms shown in FIG. 2. When the address input signals Ai and Bj are changed to read out data from the memory cell, a memory cell corresponding to the address input is selected and data thereof is read out by the sense amplifier 7. In this case, the change of the address input signal is detected by the address change detection circuit 12 and the pulse signal ATD is kept at the "1" level for a preset period of time. When the signal ATD is input to the control circuit 13, the signal ATDdly, data latch circuit control signals (DLP, $\overline{DLP}$) and data delay circuit control signals (A, B) are changed in response to the signal ATDdly. For example, when the address input signal is changed and the pulse signal ATD is set to the "1" level, the signal ATDdly is set to the "1" level and the signal DLP is set to the "1" level in response to change of the signal ATDdly. As a result, the data latch circuit 10 is set into the operative state and data d*dy (output of the data delay circuit 9) of the memory cell at the address set before the address input signal is changed is latched for a preset period of time. The latched data d*lat is output via the output buffer circuit 8. When the address signal is changed, the signal B is set to the "0" level and the data delay circuit 9 is set into the non-operative state, thereby permitting output data d* from the sense amplifier 7 to be instantaneously output via the bypass circuit 92. When the signal ATD is set to the "0" level, the signal ATDdly is changed to the "0" level after a preset period of time has elapsed. For example, the preset period of time is set to a length of time from the change of the address input signal until data of a memory cell corresponding to the address is determined by the sense amplifier circuit 7 and bypass circuit 92. The signal DLP is set to the "0" level by the change of the signal ATDdly to the "0" level and the data latch circuit 10 is set into the non-operative state. When the data latch circuit 10 is set into the non-operative state, the output data d*dly of the data delay circuit 9 is output via the data latch circuit 10 and output buffer circuit 8. When the signal DLP is set to the "0" level, the signal B is set to the "1" level and the data delay circuit 9 is set into the operative state.

When the address input signal is thus changed and data from the output buffer circuit 8 is output, the data delay circuit 9 connected to the output section of the sense amplifier circuit 7 is set into the operative state and the data delay circuit 9 functions as a noise canceller, thus providing an integrated circuit having a large operation margin.

Generally, in the semiconductor memory, it is necessary to drive a large capacitor externally provided, for example, a load capacitor of approx. 100 pF. For this reason, the current driving ability of an output stage transistor of the output buffer circuit 8 for outputting internal data of the semiconductor memory to the exterior is set to be extremely large so as to satisfactorily drive the large load capacitor.

Next, an example of the output buffer circuit 8 is shown in FIG. 3 and the operation thereof and problems associated therewith are explained. The output data d*lat from the data latch circuit 10 (FIG. 1) is supplied to an input terminal 51 of the output buffer circuit 8. In a period in which the output buffer circuit is operated, a control signal $\overline{OE^*}$ is set to the "0" level and a control signal OE* is set to the "1" level. Therefore, a P-channel MOS transistor 52 controlled by the control signal $\overline{OE^*}$ is turned on and an N-channel MOS transistor 53 is turned off. As a result, the input data d*lat is supplied to the gate of an output stage P-channel MOS transistor 58 via a CMOS inverter constructed by a P-channel MOS transistor 54 and an N-channel MOS transistor 55 and a CMOS inverter constructed by a P-channel MOS transistor 56 and an N-channel MOS transistor 57.

An N-channel MOS transistor 59 controlled by the control signal OE* is turned on and a P-channel MOS transistor 60 is turned off. As a result, the input data d*lat is supplied to the gate of an output stage N-channel MOS transistor 65 via a CMOS inverter constructed by a P-channel MOS transistor 61 and an N-channel MOS transistor 62 and a CMOS inverter constructed by a P-channel MOS transistor 63 and an N-channel MOS transistor 64. In this case, the sources of the output stage transistors 58 and 65 are respectively connected to a positive power source voltage terminal Vcc and a ground potential terminal Vss and the drains thereof are connected to an output terminal 66.

In the above output buffer circuit, one of the output stage transistors 58 and 65 is turned on according to the level of the input data d*lat. When the P-channel MOS transistor 58 is kept in the ON state, a load capacitor 67 connected to the output terminal 66 is charged to a Vcc potential, and when the N-channel MOS transistor 65 is kept in the ON state, it is discharged to a Vss potential. At this time, in order to enhance the rising speed and falling speed of data Dout to be output from the output terminal 66 by charging or discharging the load capacitor with a large current, the element sizes of the output stage transistors 58 and 65 are set large and the conductance thereof is set to a large value.

In a case where the semiconductor integrated circuit having the above output buffer circuit is incorporated into a system product, the power source voltage Vcc and ground potential Vss are supplied to the semiconductor integrated circuit via wirings from a power source unit 70. Therefore, when a large current flows in the Vcc and Vss wirings, the Vcc potential or Vss potential will largely vary by an influence of inductances 71 and 72 of the Vcc and Vss wirings. That is, if the inductance component existing in the wirings is L and the rate of variation in the current flowing in the wiring with respect to time is expressed by di/dt, then the potential variation Δv expressed by the following equation occurs in the wiring.

$$\Delta v = L(di/dt) \qquad \ldots (1)$$

FIG. 4 shows voltage and current waveforms of portions in the above output buffer circuit. In this case, Va indicates a gate potential of the output stage P-channel MOS transistor 58, Vb indicates a gate potential of the output stage N-channel MOS transistor 65, Is indicates a drain current of the P-channel MOS transistor 58, It indicates a drain current of the N-channel MOS transistor 65, and Dout indicates an output signal.

As shown in FIG. 4, when the level of the input data d*lat has varied, the gate potential Va of the output stage P-channel MOS transistor 58 and the gate potential Vb of the N-channel MOS transistor 65 are changed and the transistors 58 and 65 effect the switching operations. As s result, the drain current Is of the transistor 58 or the drain current It of the transistor 65 flows to cause potential variation in the Vcc potential or the Vss potential.

When data is thus output from the output buffer circuit, a large current flows in the output stage so as to cause potential variation in the power source voltage Vcc or ground potential Vss (which is hereinafter referred to as power source variation) in the internal portion of the integrated circuit, and an erroneous operation is caused in the integrated circuit by the power source variation. Since it is necessary to conduct a larger current when the integrated circuit is required to have a high operation speed and it is necessary to charge or discharge an external load capacitor in a short period of time, an erroneous operation caused by the charging or discharging current with respect to the load capacitor tends to more easily occur.

Next, an example of the data delay circuit 9 is shown in FIG. 5 and the function thereof as a noise canceller is explained. In the data delay circuit 9 shown in FIG. 5, output data d* from the sense amplifier 7 is input to the delay circuit 91 and the bypass circuit 92 via an inverter I9. In the delay circuit 91, an output of the inverter I9 is input to an inverter I10. The output terminal of the inverter I10 is connected to an inverter I11 via a transfer gate TG2 constructed by a parallel circuit of an N-channel transistor whose gate is applied with the Vcc potential and a P-channel transistor whose gate is applied with the Vss potential. A capacitor CP2 constructed by a P-channel transistor whose source and drain are applied with the Vcc potential and a capacitor CN2 constructed by an N-channel transistor whose source and drain are applied with the Vss potential are connected to a line connected between the transfer gate TG2 and the inverter I11.

The circuit 92 is connected in parallel with the delay circuit 91 and an output of the inverter I9 is input to an inverter I10'. The output terminal of the inverter I10' is connected to one end of a transfer gate TG3 constructed by a parallel circuit of a P-channel transistor whose gate is supplied with the signal B and an N-channel transistor whose gate is supplied with the signal A. The other end of the transfer gate TG3 is connected to an input terminal (node N1) of a clocked inverter CI1. The clocked inverter CI1 includes P- and N-channel transistors constituting an inverter section, a P-channel transistor series-connected with the inverter section and turned on by the signal B of "0" level and an N-channel transistor series-connected with the inverter section and turned on by the signal A of "1" level. Further, the other end of the transfer gate TG3 is also connected to the input terminal (node N1) of the inverter I11 of the delay circuit 91. The output terminal of the clocked inverter CI1 and the output terminal of the inverter I11 are connected together and the common connection node is connected to an inverter I12.

The delay circuit 91 receives an output from the inverter I9 and outputs the same with a preset period of delay time (for example, several tens of nanoseconds). The output is supplied as an output of the data delay circuit 9 via the inverters I11 and I12. Therefore, even when noise is superposed on the output of the inverter I9, the noise can be absorbed by the delay circuit 91 if the duration of noise is less than the above preset period of time. That is, the delay circuit 91 functions as a noise canceller.

Since the inverter I10' and transfer gate TG3 of the circuit 92 are designed to have extremely larger driving abilities in comparison with the inverter I10 and transfer gate TG2 of the delay circuit 9, the transfer gate TG3 is turned on and the clocked inverter CI1 is activated so as to permit an input from the inverter I9 to be instantaneously output when the address signal is changed and the signals A and B are respectively set to the "1" and "0" levels. The output is supplied as an output of the data delay circuit 9 via the inverter I12. Therefore, the circuit 92 functions as a bypass circuit for the delay circuit 91.

Next, a problem occurring when an erroneous operation of the sense amplifier circuit 7 is caused by the power source variation is explained with reference to FIGS. 6A and 6B.

In general, in order to cause the sense amplifier circuit 7 to read out data at a high speed, a potential difference between the two input nodes thereof is set to a small value. For this reason, the response speeds (following speeds) for variations in the Vcc potential and Vss potential become different from each other by a difference between the parasitic capacitances of the two input nodes. The relation between the potentials of the two input nodes is reversed several times by the difference between the response speeds and erroneous data is output from the sense amplifier circuit. That is, an erroneous operation occurs in the data detection by the sense amplifier circuit 7. The erroneous operation is illustrated by portions of data d* surrounded by broken lines in FIGS. 6A and 6B. When pulse noises are superposed on input data d* of the data delay circuit 9 shown in FIG. 5, the node N1 which is to be charged to "1" or discharged to "0" as shown in FIG. 6A or 6B starts to be charged or discharged to a preset stable potential. When the number of pulse noises is small, the amount of charges to be charged or discharged is small, but when the number of pulse noises is large, the potential of the node N1 will be charged or discharged to the preset stable potential. When a potential used as a reference for determining whether the potential level of an input signal is "0" or "1" level is set higher than the above stable potential in the data delay circuit shown in FIG. 5 and if input data d* of the data delay circuit is set at the "0" level, a large number of noise pulses are input as shown in FIG. 6B and the inverter I11 determines that the potential of the node N1 is at the "0" level even if the node N1 is charged to a preset potential level. That is, no erroneous operation occurs. In contrast, however, when input data d* is set at the "1" level as shown in FIG. 6A and if the above pulse noises are input, the node N1 is gradually discharged and the potential thereof reaches the above stable potential level. However, at this time, since the inverter I11 is designed to determine the stable potential as the "0" level, the inverter I11 will determine the logic level of the node N1 as the "0" level. That is, an erroneous operation occurs so as to permit erroneous data to be output from the data delay circuit. Further, erroneous data will be output from the output buffer circuit 8.

The above erroneous operation tends to more easily occur when the potential difference between the two input nodes of the sense amplifier circuit 7 is smaller. However, in order to enhance the readout speed, it is preferable to set the potential difference between the two nodes as small as possible, and therefore, the above erroneous operation will be more easily occur in a semiconductor memory which is required to have a higher operation speed.

As described above, the conventional semiconductor integrated circuit has a problem that a data delay circuit is erroneously operated when an erroneous operation occurs in the data detection by the sense amplifier circuit at the time of power source variation, and as a result, erroneous data is output from the output buffer circuit.

SUMMARY OF THE INVENTION

This invention has been made to solve the above problem, and an object of this invention is to provide a semiconductor integrated circuit which can be used to realize a highly reliable semiconductor memory in which an erroneous operation of a data delay circuit can be prevented and erroneous data can be prevented from being output from an output buffer circuit even when an erroneous operation occurs in the data detection by a sense amplifier circuit at the time of power source variation, the driving ability of an output stage transistor can be set large so that the operation margin of the integrated circuit chip for the power source variation can be increased while keeping the data readout speed high.

Further, another object of this invention is to provide a semiconductor integrated circuit having a logic circuit for effecting the logic operation to keep an output thereof unchanged when the logic levels of two delayed signal inputs are not equal to each other and change the output when the logic levels of the two delayed signal inputs become equal to each other.

A semiconductor integrated circuit according to a first aspect of this invention comprises an address change detection circuit for detecting change of an address input and generating a pulse signal; memory cells for storing data; a data detection circuit controlled by an external input signal for controlling the operation of the semiconductor integrated circuit, for detecting data stored in the memory cell; at least two delay circuits having different delay time characteristics, connected to the output terminal of the data detection circuit, and controlled according to the pulse signal of the address change detection circuit; a logic circuit connected to the output terminals of the respective delay circuits and controlled according to the pulse signal from the address change detection circuit, for keeping an output level thereof unchanged when the output data items of the delay circuits are not equal to each other and change the output level when the output data items of the delay circuits become equal to each other in a case where the delay circuits are set in the operative state; a bypass circuit connected between input terminals of the respective delay circuits and the output terminal of the logic circuit, controlled according to the pulse signal of the address change detection circuit and having a delay time characteristic shorter than the delay time characteristics of the respective delay circuits; a latch circuit connected to the output terminal of the logic circuit, the latching operation thereof being controlled according to the pulse signal of the address change detection circuit; an output buffer circuit connected to the output terminal of the latch circuit, for outputting data stored in the memory cell; and an output buffer control circuit for setting up a state in which output data from the data detection circuit is prevented from being output from the output buffer circuit for a preset period of time according to the pulse signal of the address change detection circuit.

A semiconductor integrated circuit according to a second aspect of this invention comprises a 3-input logic circuit for keeping an output thereof unchanged when the logic levels of two delayed signal inputs are no equal to each other and changing the output when the logic levels of the two delayed signal inputs become equal to each other; an inverter connected to the output terminal of the 3-input logic circuit, an output thereof being input as one of the inputs of the 3-input logic circuit; and a transfer gate connected at one end to the output terminal of the inverter and controlled according to a preset control signal; wherein the 3-input logic circuit includes first to third transistors of P-channel type series-connected between a first power source potential node and an output node, fourth and fifth transistors of P-channel type series-connected between the first power source potential node and the output node, a serial connection node between the fourth and fifth transistors being connected to a serial connection node between the second and third transistors, six and seventh transistors of N-channel type series-connected between a second power source potential node and the output node, eighth and ninth transistors of N-channel type series-connected between the second power source potential node and the output node, and tenth and eleventh transistors of N-channel type series-connected between the second power source potential node and the output node, the gates of the second, third, sixth and eighth transistors being supplied with one of the two delayed signal inputs, the gates of the first, fifth, seventh and tenth transistors being supplied with the other of the two delayed signal inputs, and the gates of the fourth, ninth and eleventh transistors being supplied with an output signal of the inverter.

In the semiconductor integrated circuit according to the first aspect of this invention, the data delay circuit and data latch circuit are connected between the sense amplifier circuit and the output buffer circuit. A pulse signal for controlling the output buffer is first generated according to a pulse output signal of the address change detection circuit, and then a latch signal which permits output data of the data detection circuit obtained before the change of the address input signal to be latched by the data latch circuit for a preset period of time is generated. Next, a delay signal is generated which sets the delay time of the data delay circuit to be short in a case where data detected by the data detection circuit is not output from the output buffer circuit, and sets the delay time of the data delay circuit to be long in a case where data is output from the output buffer circuit. Generation of the delay signal is interrupted after the pulse signal of the address change detection circuit is interrupted. As a result, the power source variation at the time of output data change or erroneous operation due to noise input from the exterior can be prevented. Further, the driving ability of the output buffer transistor can be set to a large value so that a highly reliable semiconductor integrated circuit in which the operation margin of the integrated circuit with respect to the power source variation and noise can be made large while keeping the data readout speed high can be obtained.

In this case, since a logic circuit for effecting the logic operation of keeping the output thereof unchanged when the logic levels of output signals of the two delay circuits having different delay characteristics in the data delay circuit are different from each other and changing the output thereof when the logic levels of the output signals of the two delay circuits become equal to each other is provided, erroneous data will be prevented from being output from the output buffer even when the sense amplifier circuit is erroneously operated by the power source variation.

In the semiconductor integrated circuit according to the second aspect of this invention, a logic circuit for effecting the logic operation of keeping the output thereof unchanged when the logic levels of two delay signal inputs are not equal to each other and changing the output thereof when the logic levels of the two delay signal inputs become equal to each other can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 6A and 6B are signal waveform diagrams for illustrating the operation of the data delay circuit 9 shown in FIG. 5;

FIG. 13 is a circuit diagram showing a concrete example of a control circuit 13 shown in FIG. 7;

DETAILED DESCRIPTION OF THE PREFERRED EMBODIMENTS

There will now be described an embodiment of this invention in detail with reference to the accompanying drawings.

Figure 1:
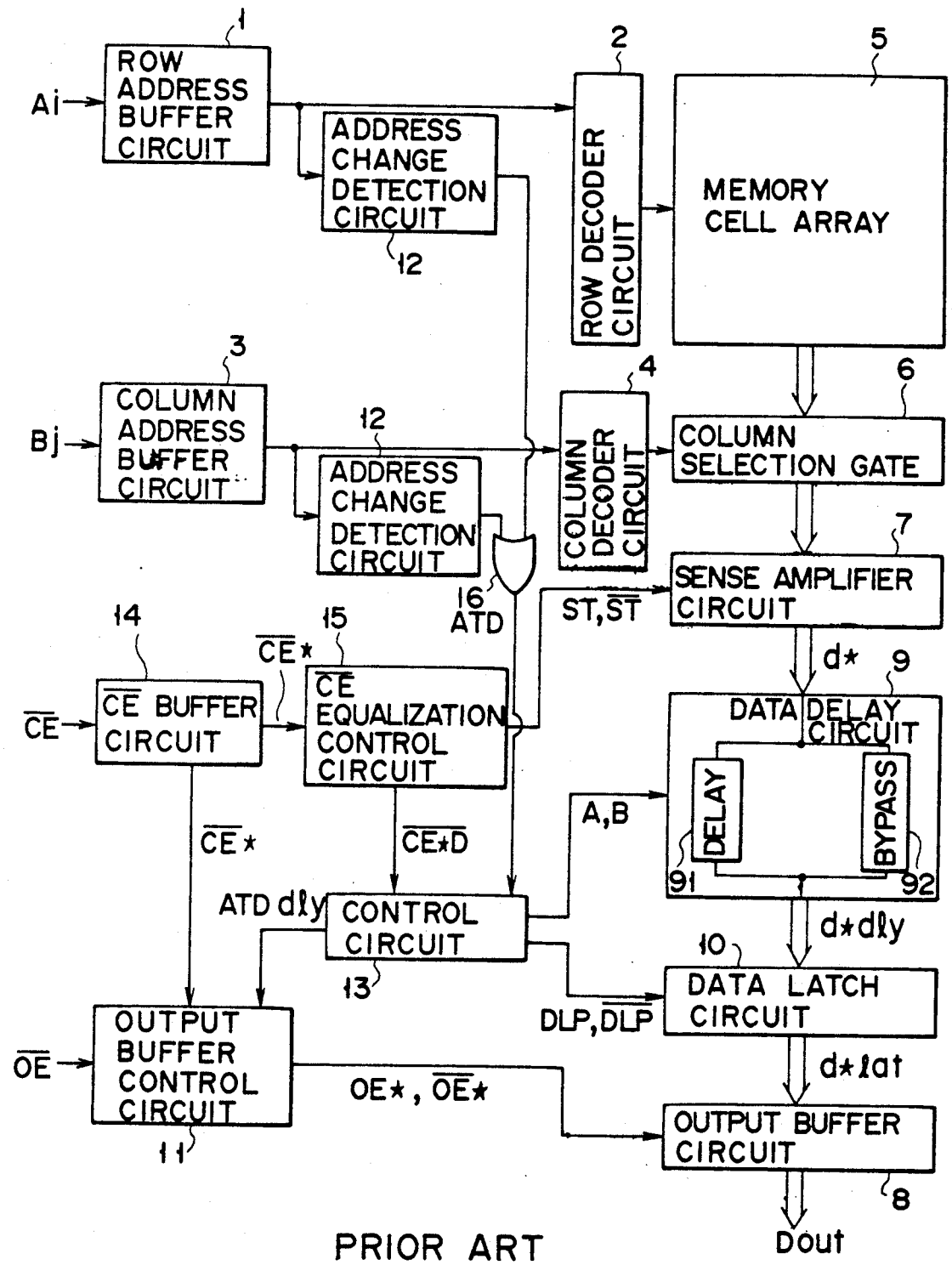
FIG. 1 is a block diagram showing part of the conventional EPROM.
Figure 2:
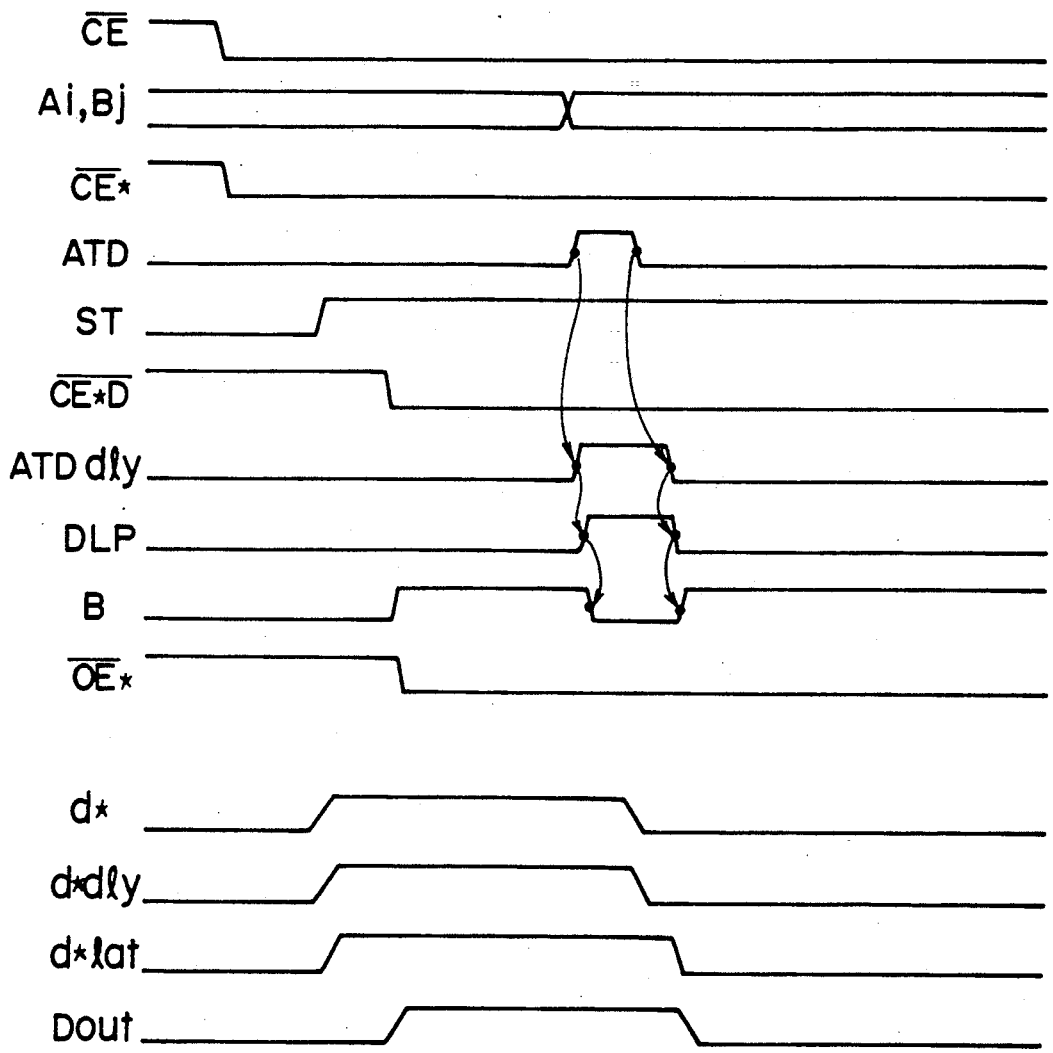
FIG. 2 is a diagram showing timing signal waveforms for illustrating the operation of the EPROM of FIG. 1.
Figure 3:
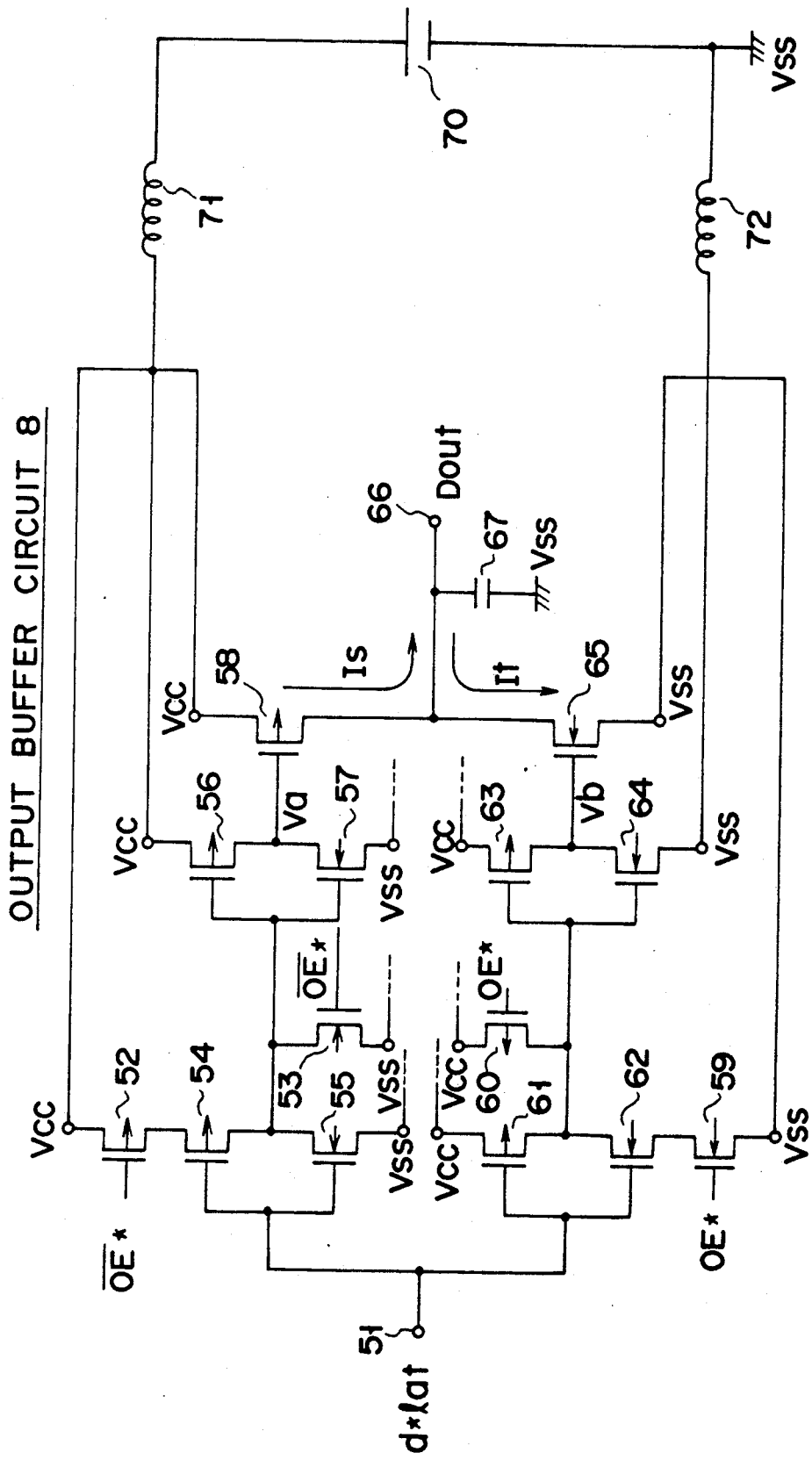
FIG. 3 is a circuit diagram showing a concrete example of an output buffer circuit 8 shown in FIG. 1.
Figure 4:
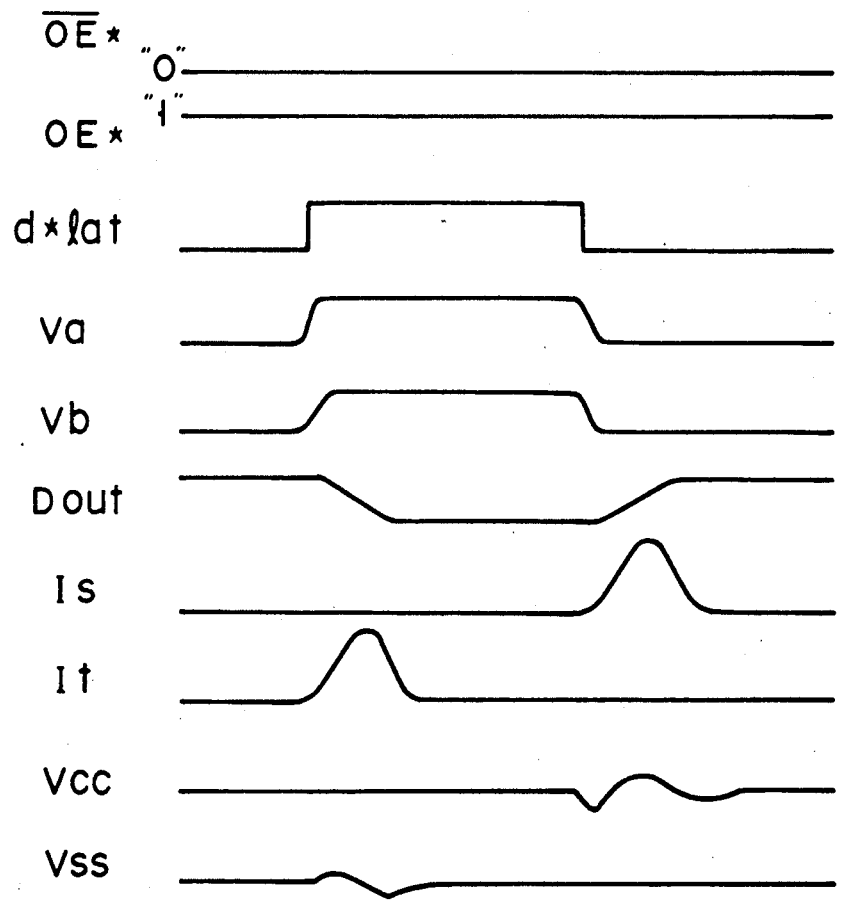
FIG. 4 is a signal waveform diagram for illustrating the operation of the output buffer circuit 8 shown in FIG. 3.
Figure 5:
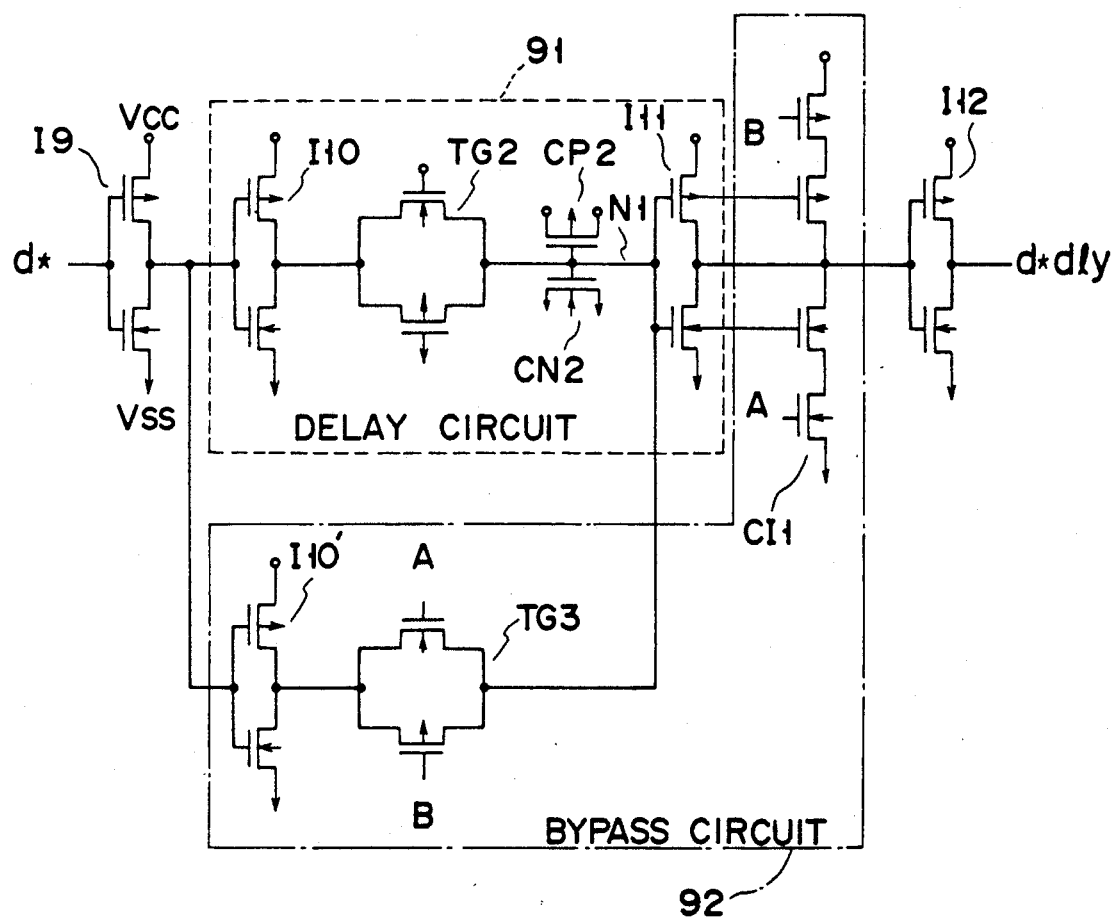
FIG. 5 is a circuit diagram showing a concrete example of a data delay circuit 9 shown in FIG. 1.
Figure 7:
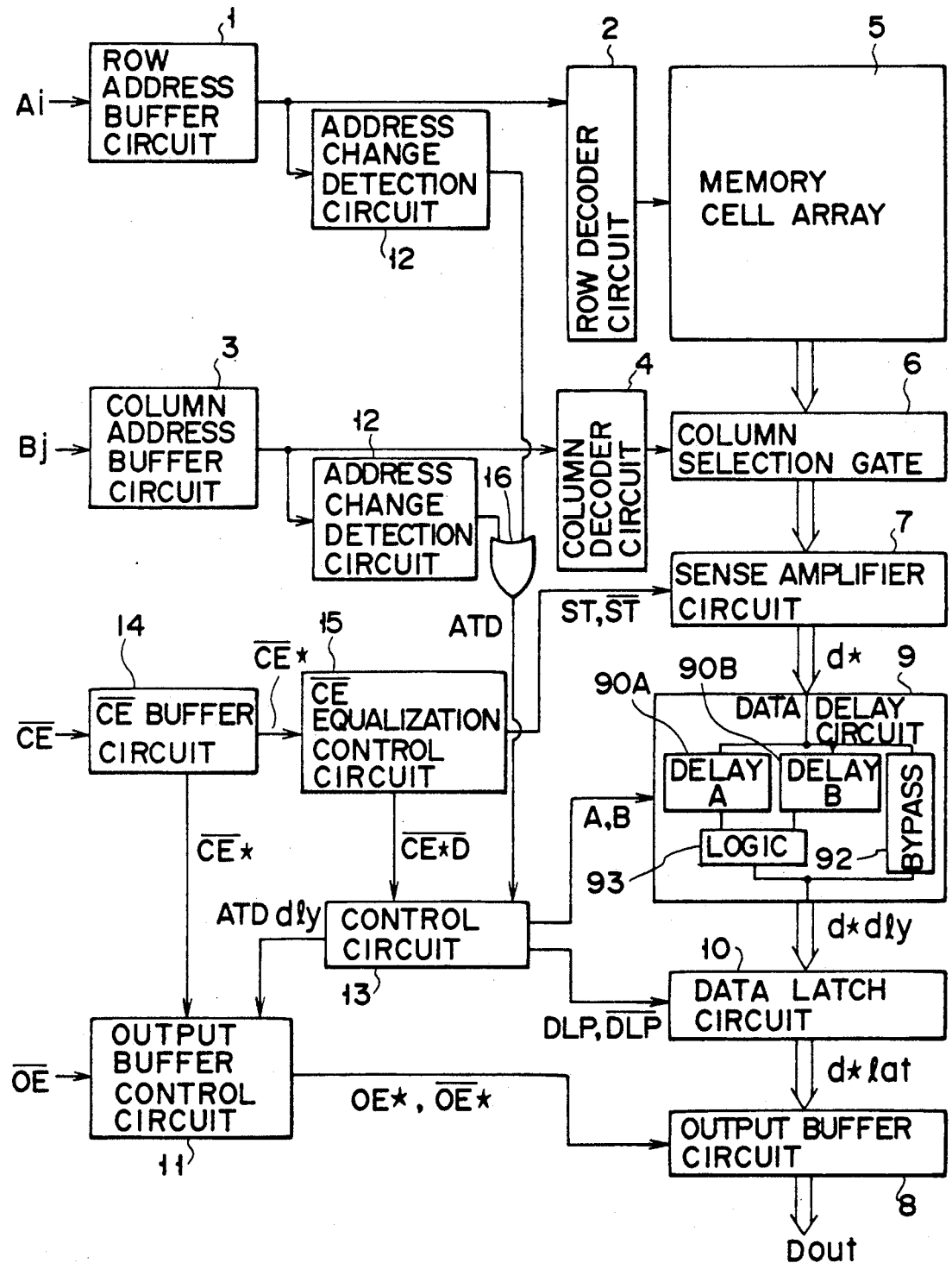
FIG. 7 is a block diagram showing part of an EPROM according to one embodiment of a semiconductor integrated circuit of this invention.

FIG. 7 shows part of a semiconductor integrated circuit, for example, EPROM in which the construction of a data delay circuit 9 is different from that of the conventional EPROM shown in FIG. 1.

That is, the data delay circuit 9 in this embodiment includes a data delay section, a bypass circuit 92, and a logic circuit 93. The data delay section includes at least two delay circuits (in this example, first delay circuit 90A and second delay circuit 90B are used) having input terminals thereof connected together and having different delay time characteristics. The bypass circuit 92 is connected between the input terminals of the two delay circuits 90A, 90B and the output terminal of the logic circuit 93 and controlled by the pulse output of the address change detection circuit 12 to instantaneously output an output d* of the sense amplifier circuit 7 without any delay. The logic circuit 93 receives output signals of the two delay circuits 90A and 90B and effects the logic operation of inhibiting d* from being output from the sense amplifier circuit 7 if the output data items of the delay circuits are not equal to each other when the delay circuits 90A and 90B are set in the operative state and permitting d* to be output from the sense amplifier circuit 7 when the output data items of the delay circuits become equal to each other.

Figure 8:
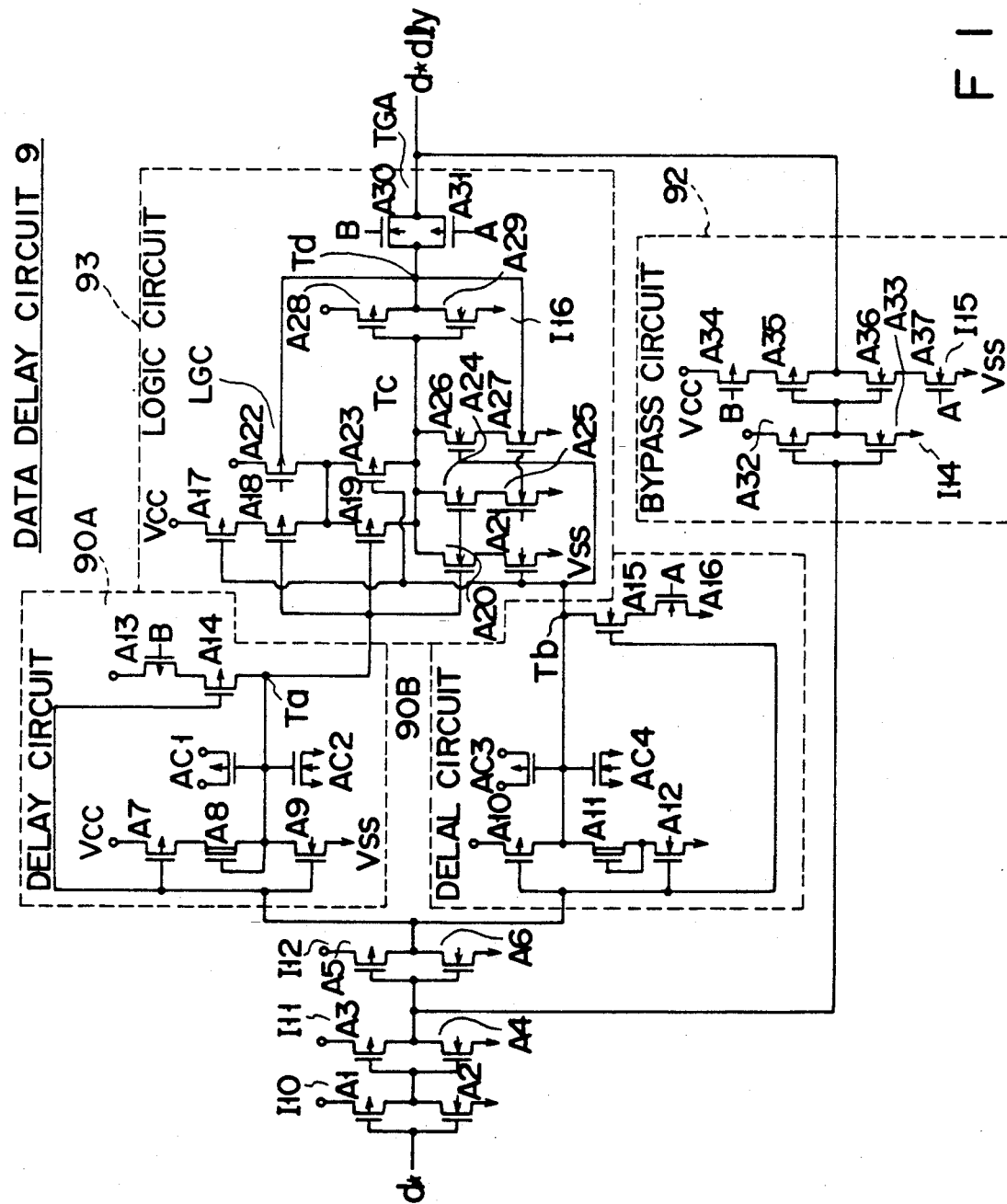
FIG. 8 is a circuit diagram showing a concrete example of a data delay circuit 9 shown in FIG. 7.

FIG. 8 shows a concrete example of the data delay circuit 9 in which A1 to A37 denote MOS transistors. Input data d* from the sense amplifier circuit 7 is input to inverters I12 and I14 via inverters I10 and I11. An output of the inverter I14 is input to a clocked inverter I15. The clocked inverter I15 is constituted by a series circuit of an N-channel transistor A36 and P-channel transistor A35 constituting an inverter section, an N-channel transistor A37 which is turned on by a signal A of "1" level, and a P-channel transistor A34 which is turned on by a signal B of "0" level. The driving abilities of the inverters I14 and I15 are set to an extremely large value such that they can instantly output the input data d* from the sense amplifier 7 without any delay. Therefore, when the address input signal is changed and the signals B and A are respectively set to the "0" and "1" levels, the clocked inverter I15 is activated and the input data d* can be instantly output. The output is supplied as an output of the data delay circuit 9. Thus, a circuit constituted by the inverters I14 and I15 functions as the bypass circuit 92 for the input data d*.

An output signal of the inverter I12 is input to the delay circuits 90A and 90B. The delay circuit 90A includes an inverter constructed by a P-channel transistor A7 and an N-channel transistor A9 whose gates are supplied with an output signal of the inverter I12 and a depletion type transistor A8 whose drain is connected to one end of the P-channel transistor A7 and whose gate and source are connected to one end of the N-channel transistor A9. The output terminal Ta of the inverter is connected to a capacitor AC1 formed of a P-channel transistor whose source and drain are applied with the Vcc potential and a capacitor AC2 formed of an N-channel transistor whose drain and source are applied with the Vss potential. Further, the terminal Ta is connected to one end of a P-channel transistor A14 whose gate is supplied with an output signal of the inverter I12. The other end of the transistor A14 is connected to one end of a P-channel transistor A13 whose gate is supplied with the signal B and the other end of the transistor A13 is connected to the Vcc power source.

The delay circuit 90B includes an inverter constructed by a P-channel transistor A10 and an N-channel transistor A12 whose gates are supplied with an output signal of the inverter I12 and a depletion type transistor A11 whose drain is connected to one end of the P-channel transistor A10 and whose gate and source are connected to one end of the N-channel transistor A12. The output terminal Tb of the inverter is connected to a capacitor AC3 formed of a P-channel transistor whose source and drain are applied with the Vcc potential and a capacitor AC4 formed of an N-channel transistor whose drain and source are applied with the Vss potential. Further, the terminal Tb is connected to one end of an N-channel transistor A15 whose gate is supplied with an output signal of the inverter I12. The other end of the transistor A15 is connected to one end of an N-channel transistor A16 whose gate is supplied with the signal A and the other end of the transistor A16 is connected to the Vss power source.

The logic circuit 93 includes a 3-input logic circuit LGC, an inverter I16 connected to the output terminal (terminal Tc) of the 3-input logic circuit LGC and a transfer gate TGA connected at one end to the output terminal (terminal Td) of the inverter I16. The other end of the transfer gate TGA is connected to the output terminal of the bypass circuit 92 to form an output terminal of the data delay circuit. The transfer gate TGA is constituted by a CMOS transfer gate having an N-channel transistor A30 whose gate is supplied with the signal B and a P-channel transistor A31 whose gate is supplied with the signal A and which is connected in parallel with the transistor A30. The 3-input logic circuit LGC is constituted by P-channel transistors A17, A18, A19, A22 and A23 and N-channel transistors A20, A21, A24, A25, A26 and A27. That is, the transistors A17, A18 and A19 are series-connected between the Vcc power source and the terminal Tc and the transistors A22 and A23 are also series-connected between the Vcc power source and the terminal Tc. A connection node between the transistors A18 and A19 is connected to a connection node between the transistors A22 and A23. Further, three sets of transistors A20 and A21; A24 and A25; and A26 and A27 are series-connected between the terminal Tc and the ground terminal Vss. The terminal Ta of the data delay circuit 90A is connected to the gates of the transistors A18, A19, A20 and A24, the terminal Tb of the data delay circuit 90B is connected to the gates of the transistors A17, A23, A21 and A26, and the output terminal Td of the inverter I16 is connected to the gates of the transistors A22, A25 and A27.

Next, the operations of the delay circuits 90A and 90B, bypass circuit 92 and logic circuit 93 are explained with reference to the waveforms of FIGS. 9A and 9B.

Figure 9A:
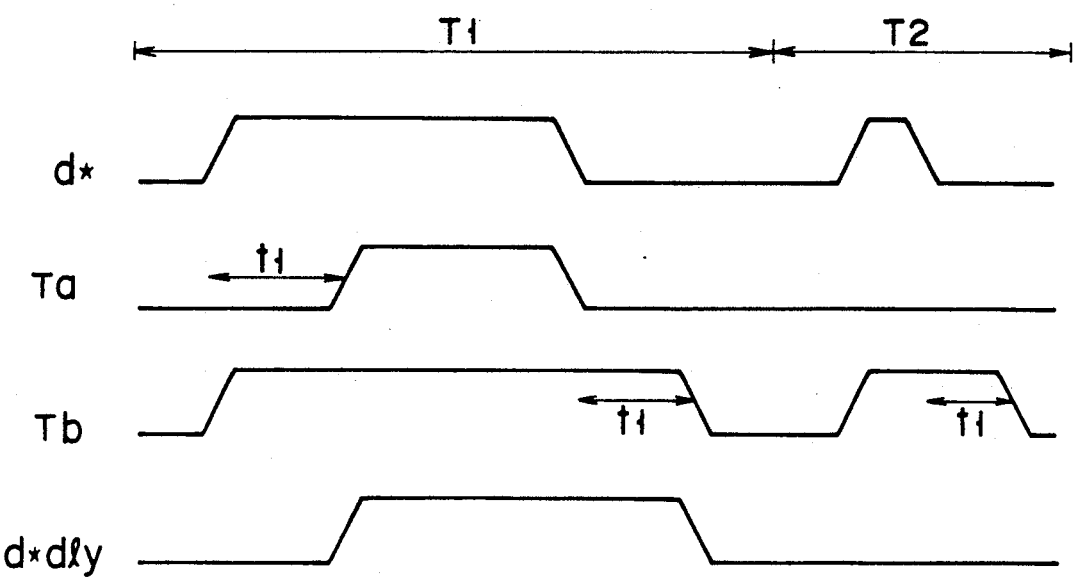
FIGS. 9A and 9B are signal waveform diagrams for illustrating the operation of the data delay circuit 9 of FIG. 8.
Figure 9B:
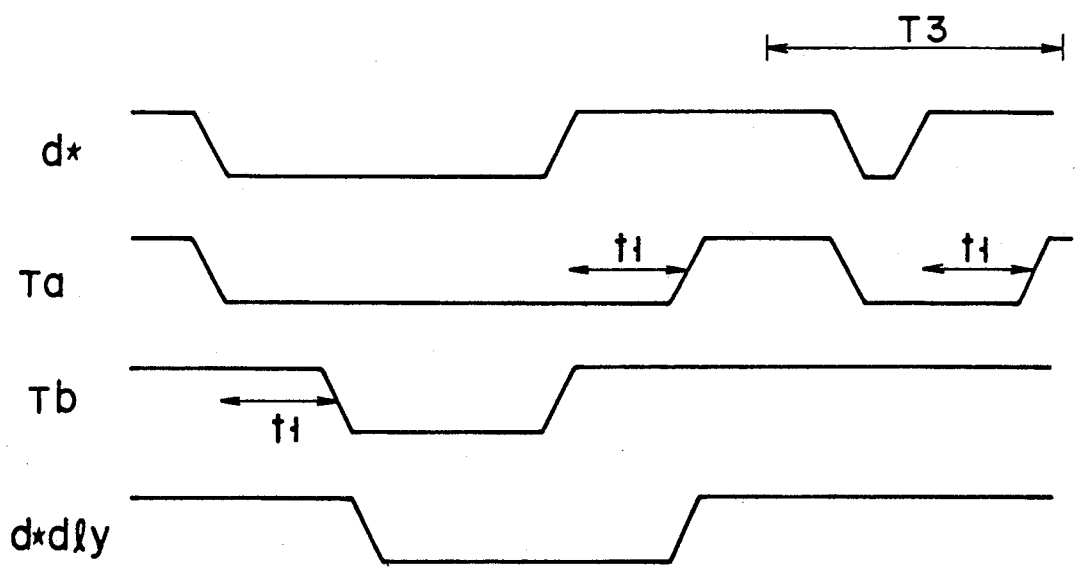

Assume now that the output signal d* of the sense amplifier 7 is changed from the "0" to "1" level as shown in FIG. 9A while the data delay circuit 9 is set in the operative state. At this time, as shown by a period T1, the potential of the terminal Tb is instantaneously set to the "1" level in response to the signal d* and the potential of the terminal Ta is set to the "1" level with delay time of t1. In this case, while the potential of the terminal Ta is set in the "0" level, the transistor A19 is set in the ON state and the transistor A22 is set in the ON state by the "0" level of the potential of the terminal Td so that the potentials of the terminals Tc and Td can be respectively kept at the "1" and "0" levels. Therefore, an output (output of the data delay circuit 9) of the logic circuit 93 is kept at the "0" level. After this, if the potential of the terminal Ta is changed to the "1" level, the transistor A20 is turned on and the transistor A21 is set in the ON state by the "1" level of the potential of the terminal Tb so that the potentials of the terminals Tc and Td will be changed to the "0" and "1" levels, respectively. As a result, an output of the logic circuit 93 is set to the "1" level. Next, assume that the output signal d* of the sense amplifier circuit 7 is changed from the "1" to "0" level as shown in FIG. 9B. At this time, the potential of the terminal Ta is instantaneously set to the "0" level in response to the signal d* and the potential of the terminal Tb is set to the "0" level with delay time of t1. In this case, while the potential of the terminal Tb is set at the "1" level, the transistor A26 is set in the ON state and the transistor A27 is set in the ON state by the "1" level potential of the terminal Td so that the potentials of the terminals Tc and Td will be kept at the "0" and "1" levels, respectively. Therefore, an output of the logic circuit 93 is kept at the "1" level. After this, when the potential of the terminal Tb is changed to the "0" level, the transistor A17 is turned on and the transistors A18 and A19 are set in the ON state by the "0" level potential of the terminal Ta so that the potentials of the terminals Tc and Td will be kept at the "1" and "0" levels, respectively. Therefore, an output of the logic circuit 93 is set to the "0" level.

The potential of the terminal Tb is changed to the "1" level in response to the signal d* by the operation of the logic circuit 93 as described above even when the signal d* is changed to and kept at the "1" level only for a period of time shorter than the time t1 as shown by the period T2 in FIG. 9A, but the potential of the terminal Ta does not respond to the signal and is kept at the "0" level. As a result, an output (output of the data delay circuit 9) of the logic circuit 93 is not changed and kept at the "0" level. In contrast, even when the signal d* is kept at the "0" level only for a period of time shorter than the time t1 as shown by the period T3 in FIG. 9B, the potential of the terminal Tb does not respond to it and is kept at the "1" level so that an output (output of the data delay circuit 9) is kept unchanged and kept at the "1" level. On the other hand, when the signals A and B are respectively set at the "1" and "0" levels, the bypass circuit 92 is set in the operative state and the delay circuits 90A and 90B and the logic circuit 93 are set in the non-operative state, thus setting the data delay circuit 9 into the non-operative state.

Figure 10A:
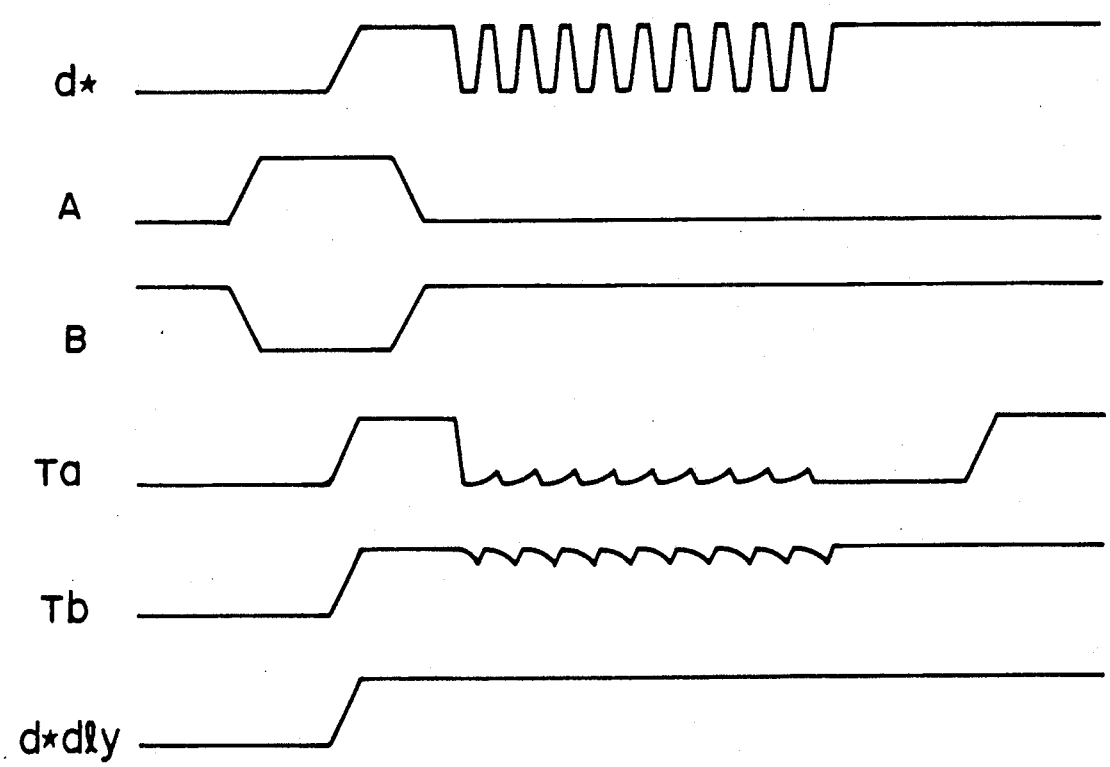
FIGS. 10A and 10B are signal waveform diagrams for illustrating the operation of the EPROM of FIG. 7, when the data delay circuit 9 functions as a noise canceller.

Next, the operation of the data delay circuit 9 functioning as a noise canceller is explained with reference to the waveforms shown in FIGS. 10A and 10B. That is, it is explained that the data delay circuit 9 will not be erroneously operated even if the sense amplifier circuit 7 is erroneously operated by the power source variation caused by the output buffer circuit 8 when the address signal is changed and data is read out and successive pulse noises are superposed on the output signal d*. When the address input signal is changed and the signal ATD generated from the address change detection circuit 12 is input to the control circuit 13, the signals A and B are generated and input to the data delay circuit 9. As shown in FIG. 10A, when the address input signal is changed and the signals A and B are respectively set to the "1" and "0" levels, the data delay circuit 9 is set in the non-operative state, and at this time, if the signal d* is changed from the "0" to "1" level, the signal d* is instantaneously output via the bypass circuit 92 as a signal d*dly. At this time, the terminal Ta shown in FIG. 8 is instantly charged by means of the transistors A13 and A14 and is set to the same potential level as the terminal Tb. Next, the signals A and B are changed, the period in which the data delay circuit 9 is set in the non-operative state is terminated, and the data delay circuit 9 is set into the operative state. Since the potentials of the terminals Ta and Tb are set at the "1" level when the data delay circuit 9 is set into the operative state, the output signal d*dly of the data delay circuit 9 is set at the "1" level. At this time, if the sense amplifier 7 is erroneously operated by the power source variation caused when data is output to the exterior so that pulse noises are superposed on the output signal d* of the sense amplifier 7 and the signal d* is changed from the "1" to "0" level, the output signal (signal on the terminal Ta) of the data delay circuit 90A is instantaneously discharged to the "0" level. On the other hand, the output signal (signal on the terminal Tb) of the data delay circuit 90B tends to be discharged towards the "0" level with a preset time constant. However, when the signal d* is changed from the "0" to "1" level again, the output signal (signal on the terminal Tb) of the data delay circuit 90B is instantaneously charged to the "1" level and will not be set to the "0" level. Further, the output signal (signal on the terminal Tb) of the data delay circuit 90A tends to be charged towards the "1" level with a preset time constant, but since the signal d* is next set to the "0" level by the erroneous operation, the output signal (signal on the terminal Ta) of the data delay circuit 90A is set to the "0" level again. Therefore, even if successive noises are superposed on the output signal d* of the sense amplifier circuit 7, the nodes Ta and Tb will not be charged or discharged to a stable potential.

Therefore, if the duration of the pulse noises is smaller than the preset time constant or preset delay time of the data delay circuit 9, the output signal (signal on the terminal Ta) of the data delay circuit 90A and the output signal (signal on the terminal Tb) of the data delay circuit 90B are not set to the same level, and in this period of time, the terminal Tc is discharged via the discharging path formed of the transistors A26 and A27 of the logic circuit 93 and is set to the "0" level and the data delay circuit output signal d*dly output from the inverter I16 which receives and inverts the "0" level signal is kept unchanged and kept at the "1" level.

Figure 10B:
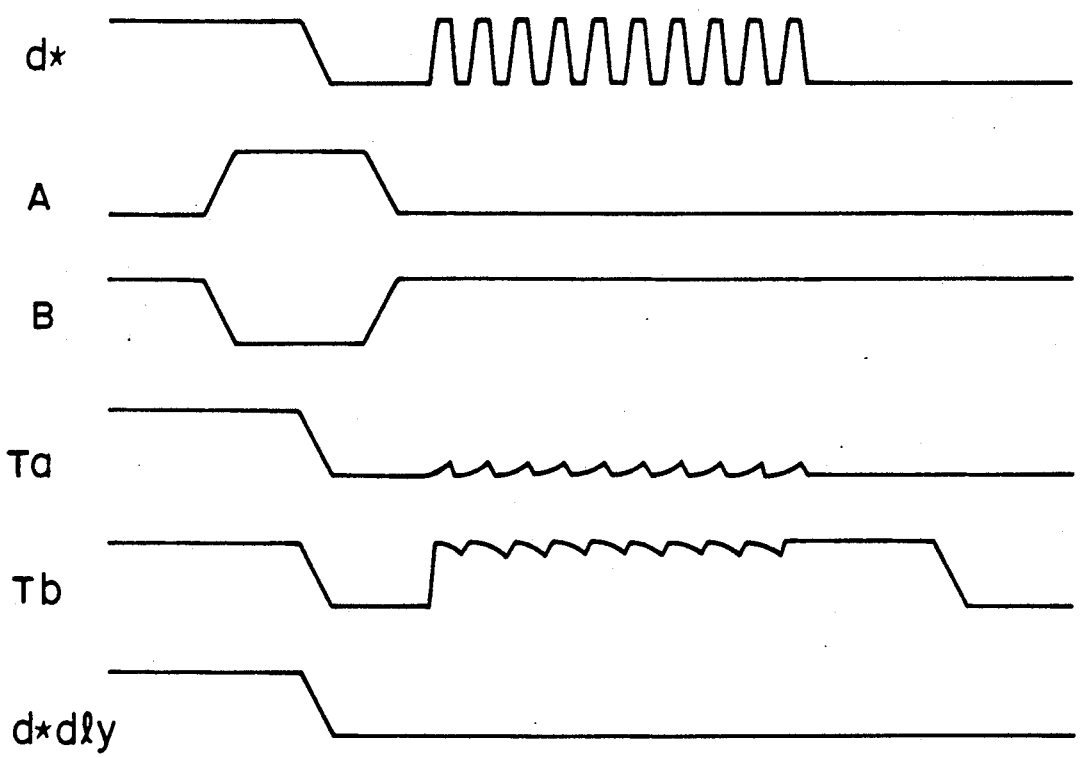

Next, assume that the output d* of the sense amplifier 7 is changed from the "1" to "0" level by the power source variation caused by the output buffer circuit 8 when the address input signal is changed and data is read out as shown in FIG. 10B. When the address input signal is changed and the signal ATD generated from the address change detection circuit 12 is input to the control circuit 13, the signals A and B are generated and input to the data delay circuit 9. When the signals A and B are respectively set at the "1" and "0" levels, the data delay circuit 9 is set in the non-operative state, and at this time, if the signal d* is changed from the "1" to "0" level, the signal d* is instantaneously output via the bypass circuit 92 as a signal d*dly. At this time, the terminal Tb shown in FIG. 8 is instantly discharged by means of the transistors A15 and A16 and is set to the same potential level as the terminal Tb. Next, the signals A and B are changed, the period in which the data delay circuit 9 is set in the non-operative state is terminated, and the data delay circuit 9 is set into the operative state. Since the potentials of the terminals Ta and Tb are set at the "0" level when the data delay circuit 9 is set into the operative state, the output signal d*dly of the data delay circuit 9 is set at the "0" level. At this time, if the sense amplifier 7 is erroneously operated by the power source variation caused when data is output to the exterior so that pulse noises are superposed on the output signal d* of the sense amplifier 7 and input to the data delay circuit 9, the potentials of the terminals Ta and Tb are not set to the same potential level if the duration of the pulse noises is smaller than the preset time constant. In this period of time, the terminal Tc is charged via the path formed of the transistors A22 and A19 of the logic circuit 93 and is set to the "1" level. The "1" level signal is inverted by the inverter I16 and set into the "0" level. The "0" level signal is supplied as the output signal d*dly of the data delay circuit 9. That is, the output signal d*dly is kept at the "0" level.

As described above, even if successive pulse noises are superposed on the output signal of the data delay circuit 9, they can be surely absorbed if the duration of the pulse noises is smaller than the preset delay time of the data delay circuit 9. Therefore, since the erroneous operation of the integrated circuit due to noise input from the exterior or the power source variation at the time of change of output data can be prevented and the driving ability of the output buffer transistor can be set to a large value, a highly reliable semiconductor integrated circuit in which the operation margin of the integrated circuit chip for the power source variation and noises can be made large while keeping the data readout speed high can be obtained.

Figure 11:
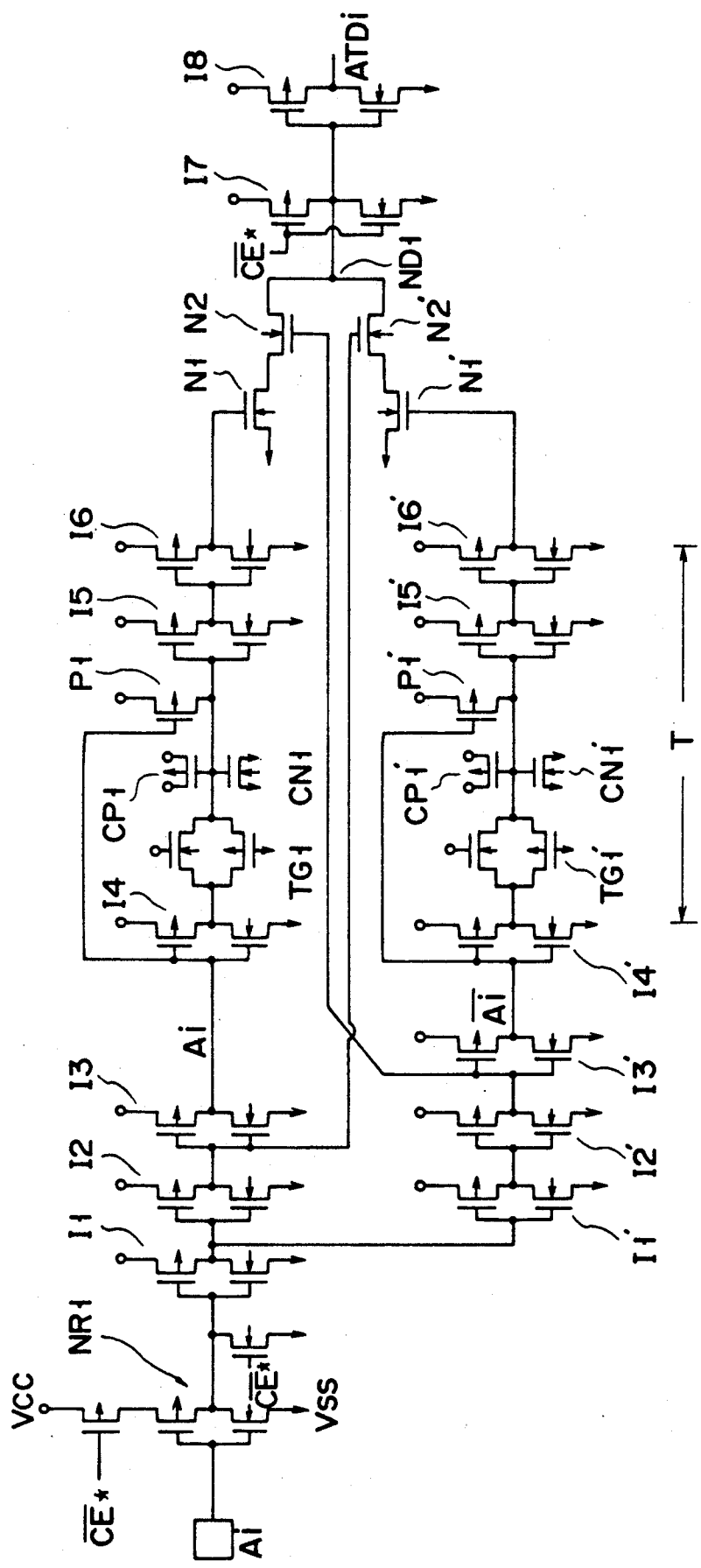
FIG. 11 is a circuit diagram showing a concrete example of a 1-bit unit of an address buffer circuit 1 and an address change detection circuit 12 shown in FIG. 7.
Figure 12:
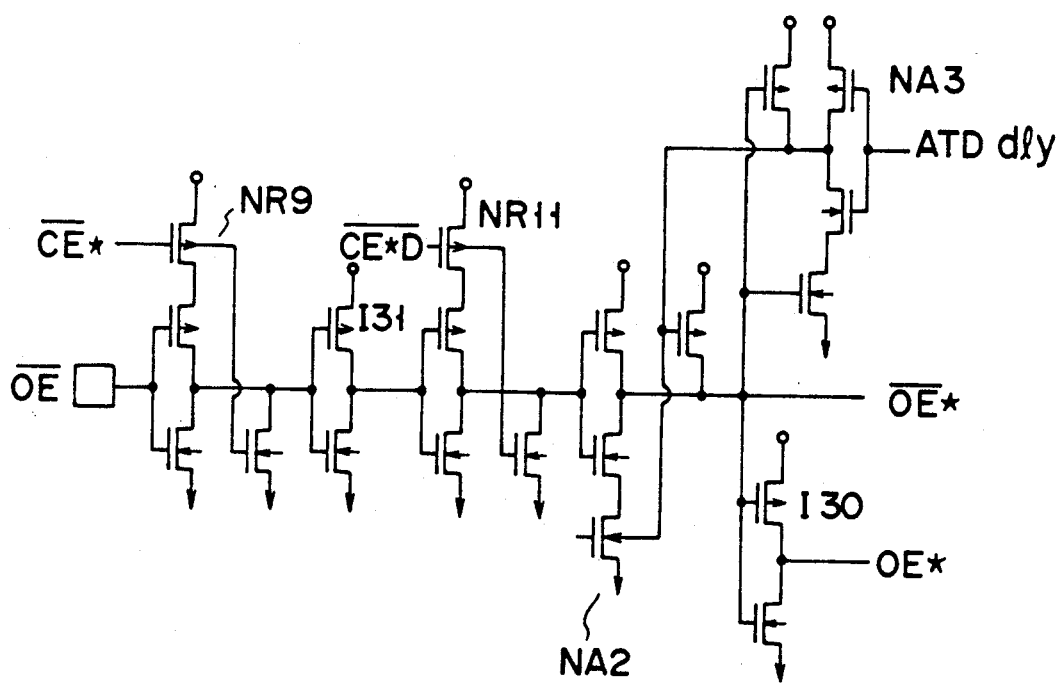
FIG. 12 is a circuit diagram showing a concrete example of an output buffer control circuit shown in FIG. 7.

Next, a concrete example of one address unit of the address change detection circuit 12 and the address buffer circuit (for example, row address buffer circuit 1) used in this embodiment is shown in FIG. 11, a concrete example of the output buffer circuit 11 is shown in FIG. 12, a concrete example of the control circuit 13 is shown in FIG. 13, and they are briefly explained.

In the address buffer circuit and address change detection circuit shown in FIG. 11, Ai indicates an address input, CE* indicates an internal chip enable signal which is created by the $\overline{CE}$ buffer circuit 14 (FIG. 7) based on the chip enable signal (or chip selection signal) $\overline{CE}$ from the exterior and is used to set the integrated circuit chip into the operative state or standby state, Vcc indicates a power source potential, and Vss indicates a ground potential. The address input Ai and signal $\overline{CE^*}$ are input to a 2-input NOR gate NR1 of the address buffer circuit. The output terminal of the NOR gate NR1 is connected to 3-stage inverters I1 to I3 and the output terminal of the inverter I1 is connected to 3-stage inverters I1' to I3'. The output Ai of the inverter I3 and the output $\overline{Ai}$ of the inverter I3' are input to the address change detection circuit section.

In the address change detection circuit, the output Ai of the inverter I3 is input to the inverter I4. The output terminal of the inverter I4 is connected to 2-stage inverters I5 and I6 via a transfer gate TG1 constructed by a parallel circuit of an N-channel transistor whose gate is supplied with the Vcc potential and a P-channel transistor whose gate is supplied with the Vss potential. The output node of the transfer gate TG1 is connected to a capacitor CP1 formed of a P-channel transistor whose source and drain are applied with the Vcc potential and a capacitor CN1 formed of an N-channel transistor whose source and drain are applied with the Vss potential. Further, a P-channel transistor P1 is connected between the output node of the transfer gate TG1 and the Vcc potential. The output Ai of the inverter I3 is input to the gate of the transistor P1.

The output terminal of the inverter I6 is connected to the gate of an N-channel transistor N1 whose source is coupled to the Vss potential and the drain of the N-channel transistor N1 is connected to the source of an N-channel transistor N2.

The output $\overline{Ai}$ of the inverter I3' is input to the inverter I4'. The output terminal of the inverter I4' is connected to 2-stage inverters I5' and I6' via a transfer gate TG1' formed of a parallel circuit of an N-channel transistor whose gate is applied with the Vcc potential and a P-channel transistor whose gate is applied with the Vss potential. The output node of the transfer gate TG1' is connected to a capacitor CP1' formed of a P-channel transistor whose source and drain are applied with the Vcc potential and a capacitor CN1' formed of an N-channel transistor whose source and drain are applied with the Vss potential. A P-channel transistor P1' is connected between the output node of the transfer gate TG1' and the Vcc potential and the output $\overline{Ai}$ of the inverter I3' is input to the gate of the transistor P1'.

The output terminal of the inverter I6' is connected to the gate of an N-channel transistor N1' whose source is coupled to the Vss potential and the drain of the N-channel transistor N1' is connected to the source of an N-channel transistor N2'. The gates of the N-channel transistors N2' and N2 are respectively supplied with an output of the inverter I2 of the address buffer circuit and an output of the inverter I2', the drains of the N-channel transistors N2 and N2' are connected together and the drain connection node (node ND1) is connected to the input terminal of the inverter I8 and to the output terminal of the inverter I7 to which the signal $\overline{CE^*}$ is input. A circuit constructed by the inverters I4, I5 and I6, and TG1, CP1, CN1 and P1 and a circuit constructed by the inverters I4', I5' and I6', and TG1', CP1', CN1' and P1' constitute delay circuits having delay time T.

In the output buffer control circuit 11 (FIG. 7) shown in FIG. 12, an output enable input signal $\overline{OE}$ is supplied as one input to a 2-input NOR gate NR9 and a signal $\overline{CE^*}$ is supplied as the other input to the NOR gate NR9. An output of the NOR gate NR9 is input to an inverter I31, an output of the inverter I31 is supplied as one input to a 2-input NOR gate NR11 and a signal $\overline{CE^*D}$ is supplied as the other input to the NOR gate NR11. An output of the NOR gate NR11 is supplied as one input to a 2-input NAND gate NA2 and an output of the NAND gate NA2 is used as the signal $\overline{OE^*}$ and is inverted by an inverter I30 and used as the signal OE*. Further, an output of the NAND gate NA2 is supplied as one input to a 2-input NAND gate NA3 and the signal ATDdly is supplied as the other input signal to the NAND gate NA3. An output of the NAND gate NA3 is supplied as the other input to the NAND gate NA2.

In the above output buffer circuit, when the signal $\overline{OE}$, signal $\overline{CE^*}$ and signal $\overline{CE^*D}$ are set at the "0" level and the signal ATDdly is set at the "1" level, the signal $\overline{OE}$ is converted into the signal $\overline{OE^*}$ by means of the NOR gate NR9, inverter I31, NOR gate NR11 and NAND gate NA2 and output, and is also converted into the signal OE* by means of the inverter I30 and output.

The complementary signals $\overline{OE^*}$ and OE* are supplied as a control signal for the output buffer circuit 8.

When the chip enable input signal $\overline{CE}$ is changed to the "0" level and data is read out, the signal CE*D is changed to the "1" level and an output of the NOR gate NR11 is set to the "0" level. Before this, the signal ATDdly is changed to the "0" level and an output of the NAND gate NA3 is changed to the "1" level. As a result, a "0" level output of the NOR gate NR11 is output as the signal $\overline{OE^*}$ of "1" level via the NAND gate NA2 and is also output as the signal $\overline{OE^*}$ of "0" level via the inverter I30. The complementary signals OE* and OE* are supplied as a control signal for the output buffer circuit 8 to keep the output of the output buffer circuit 8 in the high impedance state. When the signal $\overline{CE^*D}$ is set to the "0" level, the signals OE* and $\overline{OE^*}$ are respectively set to the "0" and "1" levels, thereby releasing the high impedance state of the output of the output buffer circuit 8.

In the control circuit 13 (FIG. 7) shown in FIG. 13, the signal ATD generated from the address change detection circuit 12 by change of the address input signal is input to an ATD delay circuit section 31 and output as the signal ATDdly with time delay. The output signal ATDdly of the ATD delay circuit section 31 is input to a data latch control circuit 32 which in turn creates complementary data latch circuit control signals DLP and $\overline{DLP}$. The signal DLP is input to a data delay control circuit section 33 which in turn creates complementary dat delay circuit control signals A and B. In this control circuit, I indicates an inverter, P indicates a P-channel transistor, N indicates an N-channel transistor, TG indicates a transfer gate and C indicates a capacitor.

Figure 14:
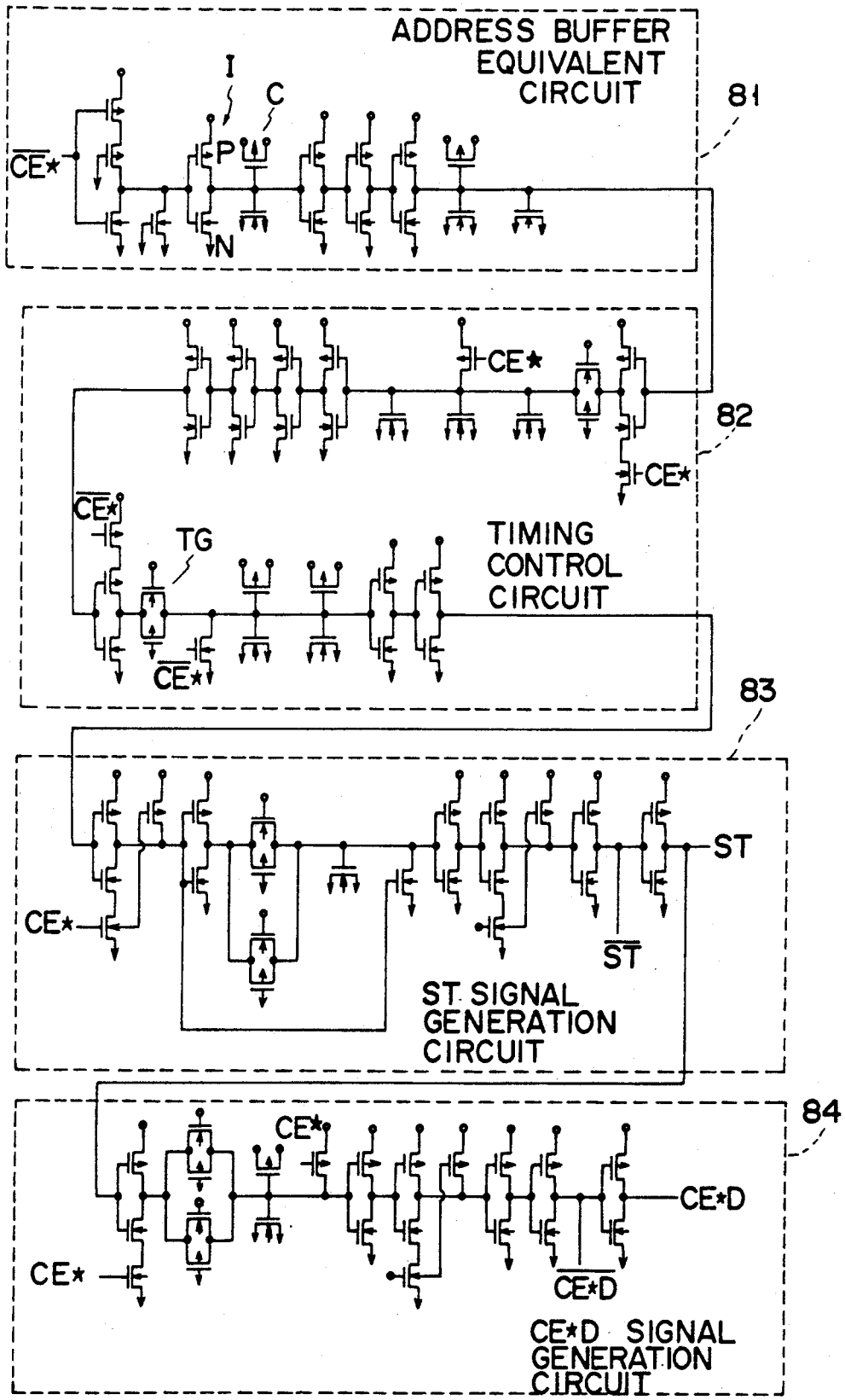
FIG. 14 is a circuit diagram showing a concrete example of a $\overline{CE}$ equalization control circuit 15 shown in FIG. 7.

FIG. 14 shows a concrete example of the $\overline{CE}$ equalization control circuit 15 in the EPROM of FIG. 7. In the CE equalization control circuit, in order to cause complementary signals ST and $\overline{ST}$ to be output from an ST signal generation circuit 83 at the same time as a preset word line in the memory cell array is actually selected after the chip is set into the selection state, a circuit 81 equivalent to the address buffer and a timing adjusting circuit 82 equivalent to the row decoder and word line are provided in the preceding stage of the ST signal generation circuit 83. That is, the signal $\overline{CE^*}$ is input to the ST signal generation circuit 83 via the address buffer circuit 81 and timing adjusting circuit 82. The output signal ST of the ST signal generation circuit 83 is input to a $\overline{CE^*D}$ signal generation circuit 84 and complementary signals CE*D and $\overline{CE^*D}$ are output from the CE*D generation circuit 84 with slight time delay with respect to the signal ST. In the $\overline{CE}$ equalization control circuit, I indicates an inverter, P indicates a P-channel transistor, N indicates an N-channel transistor, TG indicates a transfer gate and C indicates a capacitor.

Figure 15:
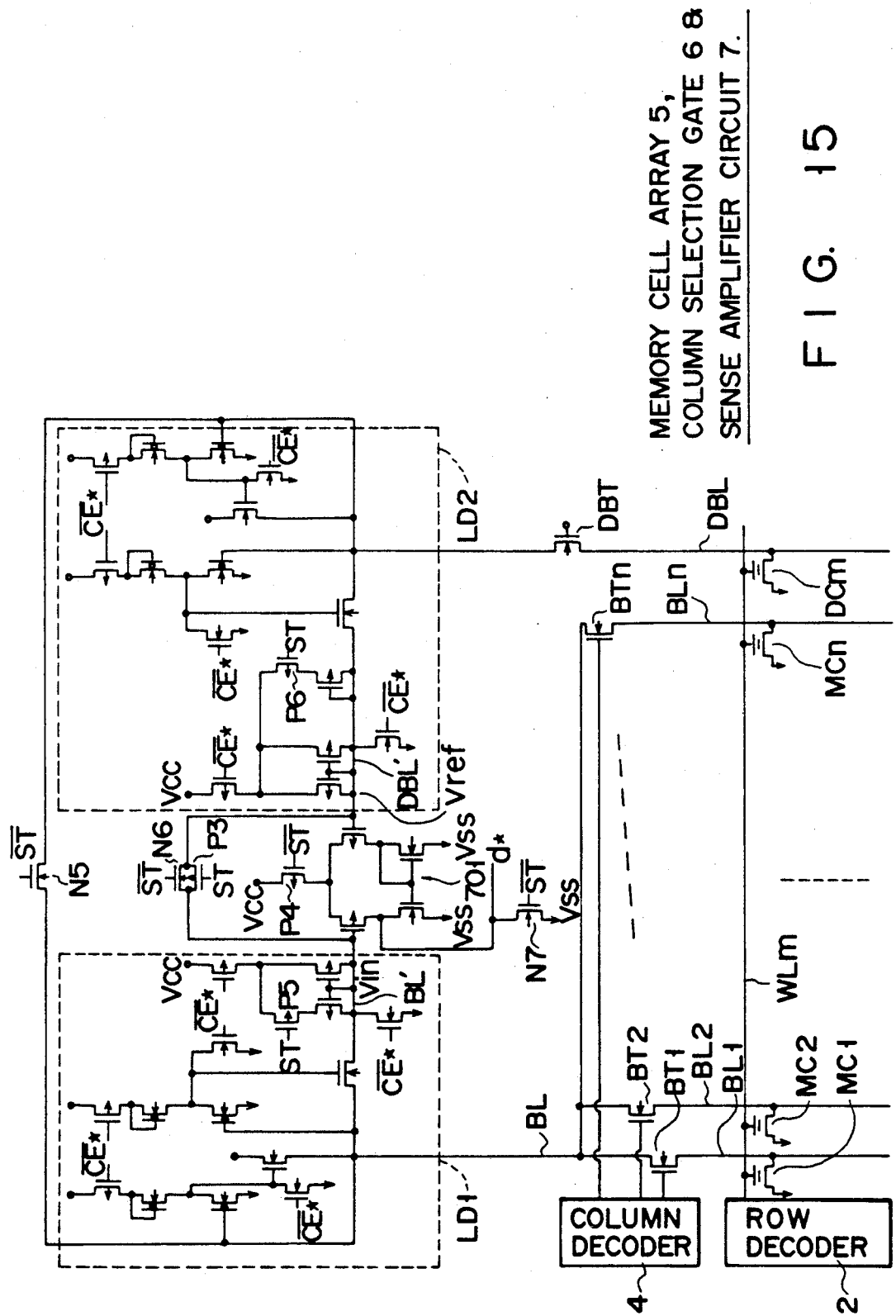
FIG. 15 is a circuit diagram showing a concrete example of a memory cell array 5, column selection gate 6 and sense amplifier circuit 7 shown in FIG. 7.

FIG. 15 shows concrete examples of the memory cell array 5, column selection gate 6 and sense amplifier circuit 7. The memory cell array 5 is constructed by an EPROM and the sense amplifier circuit 7 is constructed by a differential amplifier. In this case, MC1 to MCn denote memory cells each formed of a floating gate type MOS transistor, DCm denotes a dummy cell formed of a floating gate type MOS transistor, WLm denotes a row line, BL1 to BLn denote column lines, DBL denotes a dummy column line, 2 denotes a row decoder, 4 denotes a column decoder, BT1 to BTn denote column selection gate transistors, and DBT denotes a dummy column selection transistor which is equivalent to a desired one of the column selection gate transistors BT1 to BTn and connected to the dummy column line DBL and whose gate is applied with the Vcc potential. BL denotes a column line to which the column selection gate transistors BT1 to BTn are commonly connected, LD1 denotes a first load circuit connected to the column line BL, and LD2 denotes a second load circuit connected to the dummy column line DBL. The potential Vin of the column line BL' on the output side of the first load circuit LD1 and the potential (reference potential) Vref of the dummy column line DBL' on the output side of the second load circuit LD2 are supplied to a data detection circuit section 701 (which is constructed by a CMOS current mirror, for example) of the differential amplifier type sense amplifier circuit.

Further, an N-channel transistor N5 whose gate is supplied with the signal $\overline{ST}$ is connected between the first and second load circuits LD1 and LD2, and a CMOS transfer gate constructed by a parallel circuit of a P-channel transistor P3 whose gate is supplied with the signal ST and an N-channel transistor N6 whose gate is supplied with the signal $\overline{ST}$ is connected between the column line BL' and the dummy column line DBL' (between two input terminals of the data detection circuit section 701).

In the above sense amplifier circuit, a P-channel transistor P4 for activation control having a gate supplied with the signal $\overline{ST}$ is connected between the Vcc potential terminal and the data detection circuit section 701. When the transistor P4 is turned off, the data detection circuit section 701 is set into the non-operative state so as to reduce the current consumption. Further, an N-channel transistor N7 whose gate is supplied with the signal $\overline{ST}$ is connected between the output terminal of the data detection circuit section 701 and the ground terminal. A P-channel transistor P5 whose gate is supplied with the signal ST is provided in the first load circuit LD1 and a P-channel transistor P6 whose gate is supplied with the signal ST is provided in the second load circuit LD2.

With the construction shown in FIG. 15, memory cell data is detected by comparing the reference potential Vref of the dummy column line DBL' created by the dummy cell DCm with the potential Vin of the column line BL' created based on data read out from the memory cell by use of the sense amplifier circuit. A period from the time when the chip enable input signal $\overline{CE}$ is changed until memory cell data is read out is longer than a period from the time when the address input signal is changed until memory cell data is read out by a length of time for the integrated circuit chip to be set into the operative state by the internal chip enable input signal $\overline{CE^*}$ as described before. Next, the high speed operation of the sense amplifier circuit for solving the above problem is explained. When the chip enable input signal $\overline{CE}$ is set at the "1" level and the integrated circuit chip is set in the standby state, the signal ST is set at the "0" level. If, in this state, the chip enable input signal $\overline{CE}$ is changed to the "0" level, the signal ST is kept at the "0" level for a preset period of time (period from the time when the chip is set into the operative state until the memory cell is selected) to turn off the P-channel transistor P4 and turn on the transistors N5, N6, P3, P5 and P6 and the column line BL' and the dummy column line DBL' are connected to each other via the transistors N5, N6 and P3 and set to substantially the same potential. At this time, in order to quickly set the column line BL' and the dummy column line DBL' to the same potential, the P-channel transistor P5 of the first load circuit LD1 and the P-channel transistor P6 of the second load circuit LD2 are turned on to set the current supplying abilities of the first and second load circuits LD1 and LD2 larger than those in the normal readout operation. Further, at this time, the N-channel transistor N7 on the output side of the sense amplifier circuit is turned on and an output of the sense amplifier circuit is set to the "0" level.

Figure 16:
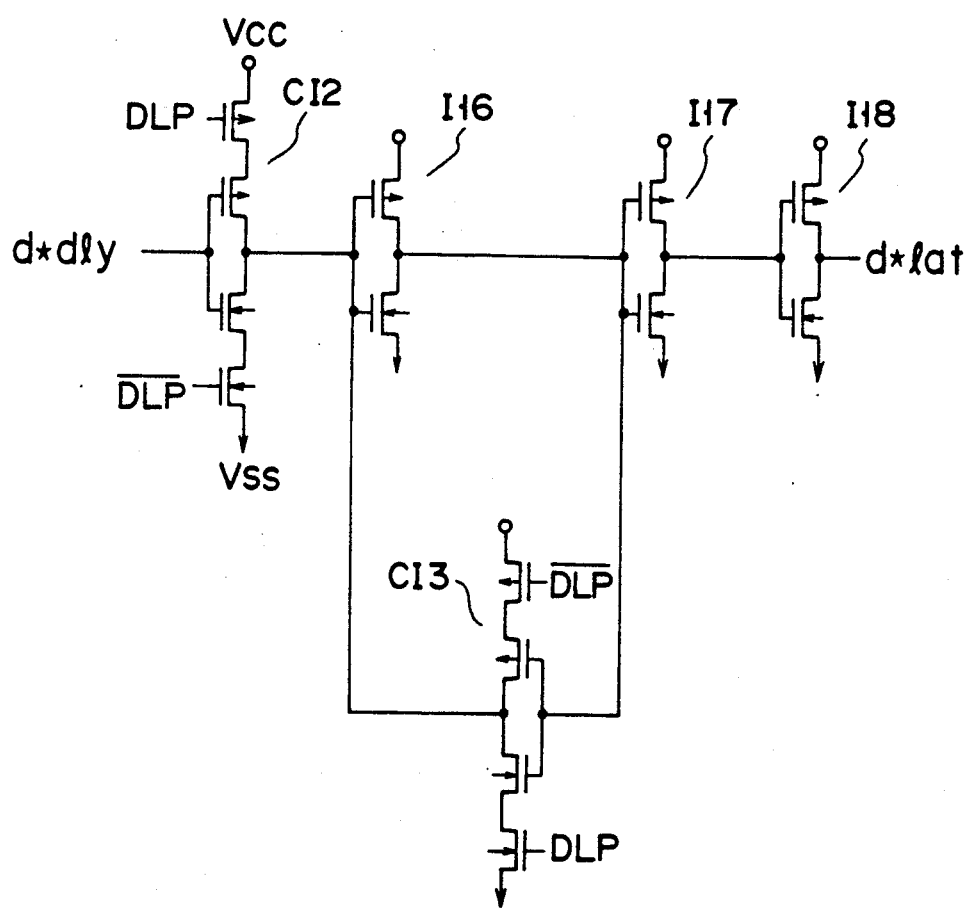
FIG. 16 is a circuit diagram showing a concrete example of a data latch circuit 10 shown in FIG. 7.

FIG. 16 shows a concrete example of the data latch circuit 10 shown in FIG. 7 and an output signal d*dly of the data delay circuit 9 is input to the clocked inverter CI2. The output terminal of the clocked inverter CI2 is connected to 3-stage inverters I16 to I18 and a latching clocked inverter CI3 is connected between the input and output nodes of the first-stage inverter I16. The input-stage clocked inverter CI2 is constructed by a series circuit of a P-channel transistor which is turned on by the "0" level of the signal DLP and an N-channel transistor which is turned on by the "1" level of the signal $\overline{DLP}$. Further, the latching clocked inverter CI3 is constructed by a series circuit of a P-channel transistor which is turned on by the "0" level of the signal $\overline{DLP}$ and an N-channel transistor which is turned on by the "1" level of the signal DLP.

Therefore, when the signal DLP is set at the "0" level, the input-stage clocked inverter CI2 is activated and the latching clocked inverter CI3 is de-activated. As a result, an input is supplied to the output buffer circuit 8 via the input-stage clocked inverter CI2 and 3-state inverters I16 to I18. On the other hand, when the signal DLP is set at the "1" level, the input-stage clocked inverter CI2 is de-activated and the latching clocked inverter CI3 is activated. As a result, an output of the first-stage inverter I16 is latched by the clocked inverter CI3 and first-stage inverter I16 and the latched data is output via the latter-stage inverters I17 and I18 as an output signal d*lat.

That is, in the EPROM of FIG. 7, the data delay circuit 9 and the data latch circuit 10 are connected between the sense amplifier circuit 7 and the output buffer circuit 8. A latch signal for permitting output data of the sense amplifier circuit 7 corresponding to memory cell data obtained before the address input signal is changed to be latched by the data latch circuit 10 for a preset period of time is generated. At this time, data latched by the data latch circuit 10 is output from the output buffer circuit 8.

At the same time as the above operation, the delay time of the data delay circuit 9 is set to be short so as to permit memory cell data corresponding to the address set after the address input signal is changed to be instantly output. The output of the data delay circuit 9 varies according to variation in the output of the sense amplifier circuit 7. At substantially the same time as the output of the data delay circuit 9 is changed to memory cell data corresponding to the newly selected address, the data delay circuit control signals A and B are changed to set the delay time of the data delay circuit 9 to be long. Next, the date latch circuit control signal is changed and memory cell data corresponding to the new address is output.

The delay time is thus set so that the erroneous operation of the integrated circuit caused by the power source variation at the time of change of output data or noise input from the exterior can be prevented and the driving ability of the output buffer transistor can be set to be large. Therefore, a highly reliable semiconductor integrated circuit can be attained in which the operation margin of the integrated circuit chip for the power source variation and noises can be made large while keeping the data readout speed high.

In this case, since the data delay circuit 9 has the logic circuit 93 which keeps the output thereof unchanged when the logic levels of the output signals of the two delay circuits having different delay time characteristics are not equal to each other and changes the output when the logic levels of the output signals of the two delay circuits are equal to each other, erroneous data can be prevented from being output from the output buffer even if the erroneous operation of the sense amplifier circuit 7 is caused by the power source variation.

This invention is not limited to the EPROM of the above embodiment, but can be applied to other types of semiconductor memories such as EEPROMs, mask ROMs, SRAMs and generally applied to semiconductor integrated circuits having input pins and output pins for outputting internal data, and a highly reliable semiconductor integrated circuit can be obtained.

As described above, according to the semiconductor integrated circuit of this invention, since the erroneous operation of the internal circuit of the integrated circuit caused by the power source variation at the time of data output or noise input from the exterior can be prevented and the driving ability of the output buffer transistor can be set to be large. Therefore, a highly reliable semiconductor integrated circuit can be attained in which the operation margin of the integrated circuit chip for the power source variation and noises can be made large while keeping the data readout speed high.

Further, according to the semiconductor integrated circuit of this invention, a logic circuit for effecting the logic operation of keeping the output thereof unchanged when the logic levels of the two delay signal inputs having different delay time characteristics are not equal to each other and changing the output when the logic levels of the two delay signal inputs are equal to each other can be realized.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit comprising:
   address change detection circuit for detecting change of an address input and generating a pulse signal;
   memory cells for storing data;
   a data detection circuit controlled by an external input signal for controlling the operation of the semiconductor integrated circuit, for detecting data stored in the memory cell;
   at least two delay circuits having different delay time characteristics, connected to the output terminal of said data detection circuit, and controlled according to the pulse signal of said address change detection circuit;
   a logic circuit connected to the output terminals of said respective delay circuits and controlled according to the pulse signal from said address change detection circuit, for keeping an output level thereof unchanged when the output data items of said delay circuits are not equal to each other and change the output level when the output data items of said delay circuits become equal to each other in a case where said delay circuits are set in the operative state;
   a bypass circuit connected between input terminals of said respective delay circuits and the output terminal of said logic circuit, controlled according to the pulse signal of said address change detection circuit and having a delay time characteristic shorter than the delay time characteristics of said respective delay circuits;
   a latch circuit connected to the output terminal of said logic circuit, the latching operation thereof being controlled according to the pulse signal of said address change detection circuit;
   an output buffer circuit connected to the output terminal of said latch circuit, for outputting data stored in said memory cell; and
   an output buffer control circuit for setting up a state in which output data from said data detection circuit is prevented from being output from said output buffer circuit for a preset period of time according to the pulse signal of said address change detection circuit.

2. A semiconductor integrated circuit comprising:
   a 3-input logic circuit for keeping an output thereof unchanged when the logic levels of two delayed signal inputs are not equal to each other and changing the output when the logic levels of the two delayed signal inputs become equal to each other;
   an inverter connected to the output terminal of said 3-input logic circuit, an output thereof being input as one of the inputs of said 3-input logic circuit; and
   a transfer gate connected at one end to the output terminal of said inverter and controlled according to a preset control signal;
   wherein said 3-input logic circuit includes first to third transistors of P-channel type series-connected between a first power source potential node and an output node, fourth and fifth transistors of P-channel type series-connected between said first power source potential node and said output node, a serial connection node between said fourth and fifth transistors being connected to a serial connection node between said second and third transistors, six and seventh transistors of N-channel type series-connected between a second power source potential node and said output node, eighth and ninth transistors of N-channel type series-connected between said second power source potential node and said output node, and tenth and eleventh transistors of N-channel type series-connected between said second power source potential node and said output node, the gates of said second, third, sixth and eighth transistors being supplied with one of the two delayed signal inputs, the gates of said first, fifth, seventh and tenth transistors being supplied with the other of the two delayed signal inputs, and the gates of said fourth, ninth and eleventh transistors being supplied with an output signal of said inverter.

3. A semiconductor integrated circuit according to claim 1, wherein said delay circuit and said bypass circuit are controlled according to the pulse signal of said address change detection circuit.

* * * * *